(12) United States Patent
Bai

(10) Patent No.: US 10,560,137 B2
(45) Date of Patent: Feb. 11, 2020

(54) MULTIWAY SWITCH, RADIO FREQUENCY SYSTEM, AND WIRELESS COMMUNICATION DEVICE

(71) Applicant: Guangdong Oppo Mobile Telecommunications Corp., Ltd., Dongguan, Guangdong (CN)

(72) Inventor: Jian Bai, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/183,710

(22) Filed: Nov. 7, 2018

(65) Prior Publication Data
US 2019/0288732 A1 Sep. 19, 2019

(30) Foreign Application Priority Data

Mar. 16, 2018 (CN) .......................... 2018 1 0220073

(51) Int. Cl.
*H04L 1/02* (2006.01)
*H04B 1/40* (2015.01)
(Continued)

(52) U.S. Cl.
CPC ............... *H04B 1/40* (2013.01); *H04B 1/005* (2013.01); *H04B 1/44* (2013.01); *H04B 7/0404* (2013.01);
(Continued)

(58) Field of Classification Search
CPC ...... H04B 1/40; H04B 7/0404; H04B 7/0686; H04B 1/005; H01Q 7/00
(Continued)

(56) References Cited

U.S. PATENT DOCUMENTS

| 2009/0054093 A1 | 2/2009 | Kim et al. |
| 2010/0002345 A1* | 1/2010 | Young ................. H01L 27/0255 361/56 |

(Continued)

FOREIGN PATENT DOCUMENTS

| CN | 101867402 A | 10/2010 |
| CN | 103905104 A | 7/2014 |

(Continued)

OTHER PUBLICATIONS

Gao Xiang et al: "Multi-switch for Antenna Selection in Massive MIMO", 2015 IEEE Global Communications Conference (GLOBECOM), IEEE, Dec. 6, 2015.

(Continued)

*Primary Examiner* — Don N Vo
(74) *Attorney, Agent, or Firm* — Young Basile Hanlon & MacFarlane, P.C.

(57) ABSTRACT

A multiway switch, a radio frequency system, and a wireless communication device are provided. The multiway switch includes five throw (T) ports and four pole (P) ports. The five T ports include one first T port coupled with all of the four P ports. The multiway switch is configured to be coupled with a radio frequency circuit and an antenna system of an electronic device operable in a dual-frequency single-transmit mode, to enable a preset function of the electronic device, the antenna system includes four antennas corresponding to the four P ports, and the preset function is a function of transmitting a sounding reference signal (SRS) through the four antennas in turn.

20 Claims, 20 Drawing Sheets

(51) Int. Cl.
  *H04B 1/00* (2006.01)
  *H04B 7/0404* (2017.01)
  *H04B 7/06* (2006.01)
  *H04Q 3/00* (2006.01)
  *H04B 1/44* (2006.01)
  *H01Q 7/00* (2006.01)
  *H03K 17/00* (2006.01)

(52) U.S. Cl.
  CPC ............ *H04B 7/0686* (2013.01); *H04Q 3/00* (2013.01); *H04Q 3/0004* (2013.01); *H01Q 7/00* (2013.01); *H03K 17/005* (2013.01); *H03K 17/007* (2013.01); *H04Q 2213/1302* (2013.01)

(58) Field of Classification Search
  USPC .................................................. 375/267, 299
  See application file for complete search history.

(56) References Cited

U.S. PATENT DOCUMENTS

| | | | |
|---|---|---|---|
| 2013/0021113 A1* | 1/2013 | Bakalski | H04B 1/18 333/176 |
| 2013/0308554 A1 | 11/2013 | Ngai et al. | |
| 2013/0335160 A1* | 12/2013 | Khlat | H01P 1/15 333/103 |
| 2014/0227982 A1 | 8/2014 | Granger-Jones et al. | |
| 2017/0195004 A1 | 7/2017 | Cheng et al. | |

FOREIGN PATENT DOCUMENTS

| | | |
|---|---|---|
| CN | 105245295 A | 1/2016 |
| CN | 106559277 A | 4/2017 |
| CN | 106685621 A | 5/2017 |
| CN | 106792938 A | 5/2017 |
| WO | 2012026601 A1 | 3/2012 |

OTHER PUBLICATIONS

Lemieux G et al: "Generating Highly-Routable Sparse Crossbars for PLDS", FPGA' 00. ACM/SIGDA International Symposium on Field Programmable Gate Arrays, Monterey, CA, Feb. 9-11, 20; [ACM/SIGDA International Symposium on Field Programmable Gate Arrays], New York, NY: ACM, US, vol. CONF.8, Jan. 1, 2000.

Extended European search report issued in corresponding European application No. 18205235.7 dated May 28, 2019.

International search report issued in corresponding international application No. PCT/CN2018/113775 dated Jan. 31, 2019.

\* cited by examiner

MULTIWAY SWITCH, RADIO FREQUENCY SYSTEM, AND WIRELESS COMMUNICATION DEVICE

CROSS-REFERENCE TO RELATED APPLICATION(S)

This application claims priority to Chinese Patent Application No. 201810220073.X, filed on Mar. 16, 2018, the entire disclosure of which is hereby incorporated by reference.

TECHNICAL FIELD

This disclosure relates to the field of mobile terminal technologies, and more particularly to a multiway switch, a radio frequency system, and a wireless communication device.

BACKGROUND

With the popularity of electronic devices such as smart phones, the smart phone can support an increasing number of applications and is becoming more and more powerful. The smart phone is developing in a diversified and personalized way, becoming an indispensable electronic product in users' life. In the fourth generation (4G) mobile communication system, the electronic device generally adopts a single-antenna or dual-antenna radio frequency (RF) system architecture. Currently, in a new radio (NR) system of the fifth generation (5G) mobile communication system, requirements on an electronic device supporting a four-antenna RF system architecture are proposed.

SUMMARY

Implementations of the disclosure provide a multiway switch, a radio frequency system, and a wireless communication device.

According to a first aspect of the disclosure, a multiway switch is provided. The multiway switch includes five throw (T) ports and four pole (P) ports. The five T ports include one first T port coupled with all of the four P ports. The multiway switch is configured to be coupled with a radio frequency circuit and an antenna system of an electronic device operable in a dual-frequency single-transmit mode, to enable a preset function of the electronic device, the antenna system includes four antennas corresponding to the four P ports, and the preset function is a function of transmitting a sounding reference signal (SRS) through the four antennas in turn.

According to a second aspect of the disclosure, a radio frequency system is provided. The radio frequency system includes an antenna system, a radio frequency transceiver, a radio frequency circuit coupled with the radio frequency transceiver, and a multiway switch coupled with the radio frequency circuit and the antenna system. The multiway switch includes five T ports and four P ports. The five T ports include one first T port supporting only a transmission function and four second T ports supporting only a reception function. The first T port is coupled with all of the four P ports. The antenna system includes four antennas corresponding to the four P ports.

The multiway switch is configured to enable a preset function of transmitting an SRS through the four antennas in turn.

According to a third aspect of the disclosure, a wireless communication device is provided. The wireless communication device includes a radio frequency transceiver, a radio frequency circuit coupled with the radio frequency transceiver, an antenna system, and the multiway switch coupled with the radio frequency circuit and the antenna system. The multiway switch includes five T ports and four P ports. The five T ports include one first T port coupled with all of the four P ports. The antenna system includes four antennas corresponding to the four P ports.

The multiway switch is configured to enable a preset function of transmitting an SRS through the four antennas in turn.

BRIEF DESCRIPTION OF THE DRAWINGS

To describe technical solutions in implementations of the present disclosure or in the related art more clearly, the following briefly introduces the accompanying drawings required for describing the implementations or the related art. Apparently, the accompanying drawings in the following description only illustrate some implementations of the present disclosure. Those of ordinary skill in the art may also obtain other drawings based on these accompanying drawings without creative efforts.

DETAILED DESCRIPTION

Figure 1:
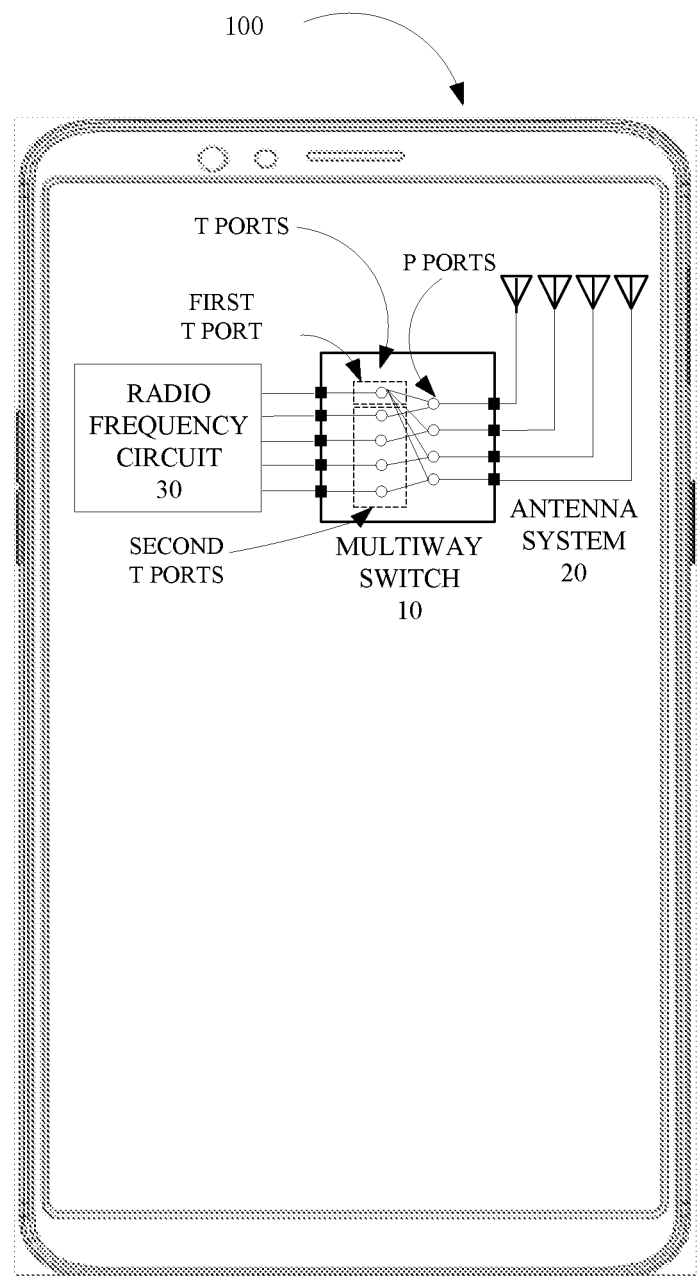
FIG. 1 is a schematic structural diagram illustrating a multiway switch according to an implementation of the present disclosure.

Technical solutions in implementations of the present disclosure will be described clearly and completely hereinafter with reference to the accompanying drawings described in the previous chapter. Apparently, the described implementations are merely some rather than all implementations of the present disclosure. All other implementations obtained by those of ordinary skill in the art based on the implementations of the present disclosure without creative efforts shall fall within the protection scope of the present disclosure.

The terms "first", "second", and the like used in the specification, the claims, and the accompanying drawings of the present disclosure are used to distinguish different objects rather than describe a particular order. In addition, the terms "include", "comprise", and "have" as well as variations thereof are intended to cover non-exclusive inclusion. For example, a process, method, system, product, or apparatus including a series of steps or units is not limited to the listed steps or units, on the contrary, it can optionally include other steps or units that are not listed; alternatively, other steps or units inherent to the process, method, product, or device can be included either.

The term "embodiment" or "implementation" referred to herein means that a particular feature, structure, or feature described in conjunction with the implementation may be contained in at least one implementation of the present disclosure. The phrase appearing in various places in the specification does not necessarily refer to the same implementation, nor does it refer to an independent or alternative implementation that is mutually exclusive with other implementations. It is explicitly and implicitly understood by those skilled in the art that an implementation described herein may be combined with other implementations.

The electronic device involved in the implementations of the disclosure may include various handheld devices, in-vehicle devices, wearable devices, computing devices that have wireless communication functions or other processing devices connected to wireless modems, as well as various forms of user equipments (UE), mobile stations (MS), terminal devices, and the like. For the convenience of description, the above-mentioned devices are collectively referred to as an electronic device.

At present, sounding reference signal (SRS) switching in four antennas of a mobile phone is a mandatory option for the China mobile communications corporation (CMCC) in the China mobile fifth generation (5G) Scale Test Technology White Paper_Terminal, which is optional in the third generation partnership project (3GPP). Its main purpose is for a base station to determine quality and parameters of four channels via detecting uplink signals of four antennas of the mobile phone, to perform a beamforming of a downlink massive multi-input multi-output (MIMO) antenna array on the four channels according to a channel reciprocity, and finally to obtain the best data transmission performance for a downlink 4×4 MIMO.

To satisfy requirements of SRS switching in four antennas, a radio frequency architecture based on a simplified four-pole n-throw (4PnT) antenna switch is proposed in the implementations of the disclosure. Compared with a 3P3T/DPDT/multiway small switch switching scheme, the present switching scheme can reduce the number of series switches in each path by integrating all or part of switches into the 4PnT switch, thereby reducing link loss and optimizing the overall transmission and reception performance of the terminal. The implementations of the present application are described in detail below.

In the context of the disclosure, "P port" is the abbreviation of "pole port", which refers to ports coupled with antennas of a multiway switch. "T port" is the abbreviation of "throw port", which refers to ports coupled with radio frequency modules of the multiway switch. The multiway switch is a four-pole five-throw (4P5T) switch for example.

In the context of the disclosure, the abbreviation "LNA" refers to a low-noise amplifier and the abbreviation "PA" refers to a power amplifier. It should be noted that, "Module" can refer to circuits and any combination of related components.

According to an implementation of the disclosure, a multiway switch is provided. The multiway switch includes five T ports and four P ports. The five T ports include one first T port coupled with all of the four P ports. The multiway switch is configured to be coupled with a radio frequency circuit and an antenna system of an electronic device operable in a dual-frequency single-transmit mode, to enable a preset function of the electronic device. The antenna system includes four antennas corresponding to the four P ports. The preset function is a function of transmitting an SRS through the four antennas in turn.

According to an implementation of the disclosure, a radio frequency system is provided. The radio frequency system includes an antenna system, a radio frequency transceiver, a radio frequency circuit coupled with the radio frequency transceiver, and a multiway switch coupled with the radio frequency circuit and the antenna system. The multiway switch includes five T ports and four P ports. The five T ports include one first T port supporting only a transmission function and four second T ports supporting only a reception function. The first T port is coupled with all of the four P ports. The antenna system includes four antennas corresponding to the four P ports. The multiway switch is configured to enable a preset function of transmitting an SRS through the four antennas in turn.

According to an implementation of the disclosure, a wireless communication device is provided. The wireless communication device includes a radio frequency transceiver, a radio frequency circuit coupled with the radio frequency transceiver, an antenna system, and the multiway switch coupled with the radio frequency circuit and the antenna system. The multiway switch includes five T ports and four P ports. The five T ports include one first T port coupled with all of the four P ports. The antenna system includes four antennas corresponding to the four P ports. The multiway switch is configured to enable a preset function of transmitting an SRS through the four antennas in turn.

FIG. 1 is a schematic structural diagram illustrating a multiway switch 10 according to an implementation of the present disclosure. As illustrated in FIG. 1, the multiway switch 10 is applicable to an electronic device 100. The electronic device 100 is operable in a dual-frequency single-transmit mode. The electronic device 100 includes an antenna system 20 and a radio frequency circuit 30. The antenna system 20 includes four antennas. The multiway switch 10 includes five T ports and four P ports. The five T ports include one first T port coupled with all of the four P ports (that is, fully-coupled). The four antennas correspond to the four P ports; specifically, the four antennas and the four P ports are in one-to-one correspondence.

The multiway switch 10 is configured to be coupled with the radio frequency circuit 30 and the antenna system 20 to implement a preset function of the electronic device 100, and the preset function is a function of transmitting an SRS through the four antennas corresponding to the four P ports in turn.

Since five T ports are included, the 4PnT multiway switch is simplified to 4P5T in implementations of the present disclosure.

The transmit antennas refer to antennas supporting a transmission function (that is, a signal transmission function) of the four antennas.

The concept of coupling, full coupling, or other kinds of coupling between the T ports and the P ports of the multiway switch described in the implementations of the disclosure refer to a state in which the T ports are coupled with the P ports through first switch transistors. The concept of "full coupling" (fully coupled) of the T ports and the P ports of the multiway switch described in the implementations of the disclosure refers to a state in which the T ports are coupled with all of the P ports through first switch transistors. For example, a first T port is fully coupled with four P ports, which means the first T port is coupled with all of the four P ports. It should be noted that, one T port or one P port may be one port of a second switch transistor. The first switch transistors are configured to control a unidirectional conduction state between the T ports and the P ports (i.e., a unidirectional conduction state from the T ports to the P ports or from the P ports to the T ports). The first switch transistor can be, for example, a switch array composed of three metal-oxide-semiconductor (MOS) transistors. When the first switch transistor is disconnected and not grounded, parasitic parameters will greatly affect performance of other connected ports. Therefore, the first switch transistor is implemented with three MOS transistors, where the three MOS transistors can be in a common source connection, that is, coupled at a common source. When the first switch transistor is disconnected, two MOS transistors at two ends are disconnected and one MOS transistor in the middle is grounded. The second switch transistor is configured to enable a corresponding port (i.e., a T port or a P port) and can be, for example, a MOS transistor. It should be noted that, the specific configurations of the first switch transistor and the second switch transistor are not limited herein. In an implementation, the electronic device can control paths between the T port and the P port to switch on through the first switch transistor. As an implementation, the electronic device can be provided with a dedicated controller to be coupled with switch transistors of the multiway switch.

The transmitting an SRS through the four antennas corresponding to the four P ports in turn refers to a process in which an electronic device interacts with a base station based on a polling mechanism to determine quality of an uplink channel corresponding to each antenna.

The electronic device 100 can be a mobile phone or other terminal devices supporting the fifth generation new radio (5G NR), such as a customer premise equipment (CPE) or a portable broadband wireless device (for example, a mobile WiFi, MIFI).

The dual-frequency single-transmit mode mentioned above refers to an operating mode in which the electronic device can support dual frequency band-one uplink (UL) transmit path or dual frequency band-four downlink (DL) receive paths.

The first T port is a port fully coupled with the four P ports. The five T ports further include second T ports, and each of the second T ports is coupled with one of the four P ports.

In an implementation, the electronic device 100 further includes a radio frequency transceiver. The radio frequency transceiver is coupled with the radio frequency circuit and constitutes a radio frequency system of the electronic device 100 together with the radio frequency circuit, the multiway switch, and the antenna system.

Figure 2:
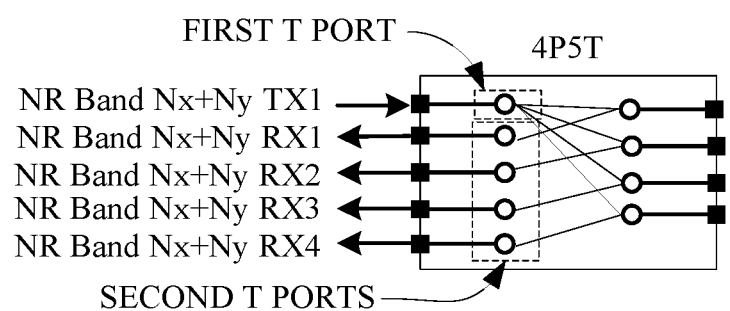
FIG. 2 is a schematic structural diagram illustrating a four-pole five-throw multiway switch according to an implementation of the present disclosure.

FIG. 2 is a schematic structural diagram illustrating a multiway switch. "NR Band Nx" indicates a first frequency band. "NR Band Ny" indicates a second frequency band. "TX1" represents a first T port 1 that only supports a transmission function. "RX1" represents a second T port 1 supporting a reception function, "RX2" represents a second T port 2 supporting a reception function, "RX3" represents a second T port 3 supporting a reception function, and "RX4" represents a second T port 4 supporting a reception function.

In this implementation, the electronic device includes the antenna system, the radio frequency circuit, and the multiway switch. The antenna system includes the four antennas. The multiway switch includes the five T ports and the four P ports. The multiway switch is configured to be coupled with the radio frequency circuit and the antenna system to implement a function of the electric device of transmitting an SRS through the four antennas corresponding to the four P ports in turn.

In one possible implementation, the five T ports further include four second T ports. Each of the four second T ports is coupled with one of the four P ports, and among the four second T ports, second T ports operable at the same frequency band are coupled with different P ports of the four P ports. Each of the four P ports is coupled with a corresponding antenna of the four antennas. The first T port only supports a transmission function and the four second T ports only support a reception function.

Among the four second T ports, second T ports operable at the same frequency band are coupled with different P ports of the four P ports (in other words, any two T ports of same frequency band are coupled with different P ports).

When the electronic device is in a downlink 4*4 multiple-input multiple-output (MIMO) mode, the four T ports in receiving state at the same frequency band are coupled with the four P ports in one-to-one correspondence.

In this implementation, since the multiway switch includes the first T port and the four second T ports, in comparison with a configuration in which all T ports are fully coupled with P ports, for the multiway switch provided herein, the number of switches is reduced. That is, the number of the switches of transmit paths and/or receive paths of the radio frequency system of the electronic device can be reduced, thereby reducing path loss, improving transmit power/sensitivity, data transmission rate in the 5G NR, uplink and downlink coverage of the mobile phone, and reducing power consumption and cost.

In one possible implementation, the radio frequency circuit of the electronic device logically includes two transmitter circuits and eight receiver circuits. The radio frequency circuit physically includes one independent circuit module. The independent circuit module has one transmit port and multiple receive ports, the transmit port is configured to be coupled with the first T port, and each receive port is configured to be coupled with a corresponding second T port, that is, the multiple receive ports are configured to be coupled with multiple second T ports in one-to-one correspondence.

The "transmit-receive port", "transmit port", or "receive port" herein refers to a port (may be composed of one or more components) which implements a corresponding transmission and/or reception function and is located on the path of a transmitter circuit, on the path of a receiver circuit, or located on the path after integration of one or more transmitter circuits and/or one or more receiver circuits. It should be noted that the ports such as transmit ports, receive ports, and transmit-receive ports illustrated in the figures are exemplary and do not intend to indicate an exact port position and impose any restrictions.

The radio frequency circuit described as separated modules may be physically separated or logically separated. The terms "physically" or "logically" therein may be adopted according to an actual need, to implement the objective of solutions provided in the disclosure. In other words, "physically" or "logically" can be equivalent to each other.

In one possible implementation, the independent circuit module is embodied as a first independent circuit module 3100 including one first port and multiple second ports, the first port is configured to be coupled with the first T port of the multiway switch, and each second port is configured to be coupled with a corresponding second T port of the multiway switch (that is, one of the four second T ports of the multiway switch). The independent circuit module 3100 includes one transmitter integrated circuit and four receiver integrated circuits. The transmitter integrated circuit includes two transmitter circuits, and the two transmitter circuits have two transmit ports coupled with the first port of the independent circuit module 3100. Each of the four receiver integrated circuits includes two receiver circuits, and the two receiver circuits have two receive ports coupled with one of the second ports of the independent circuit module 3100.

Figure 3:
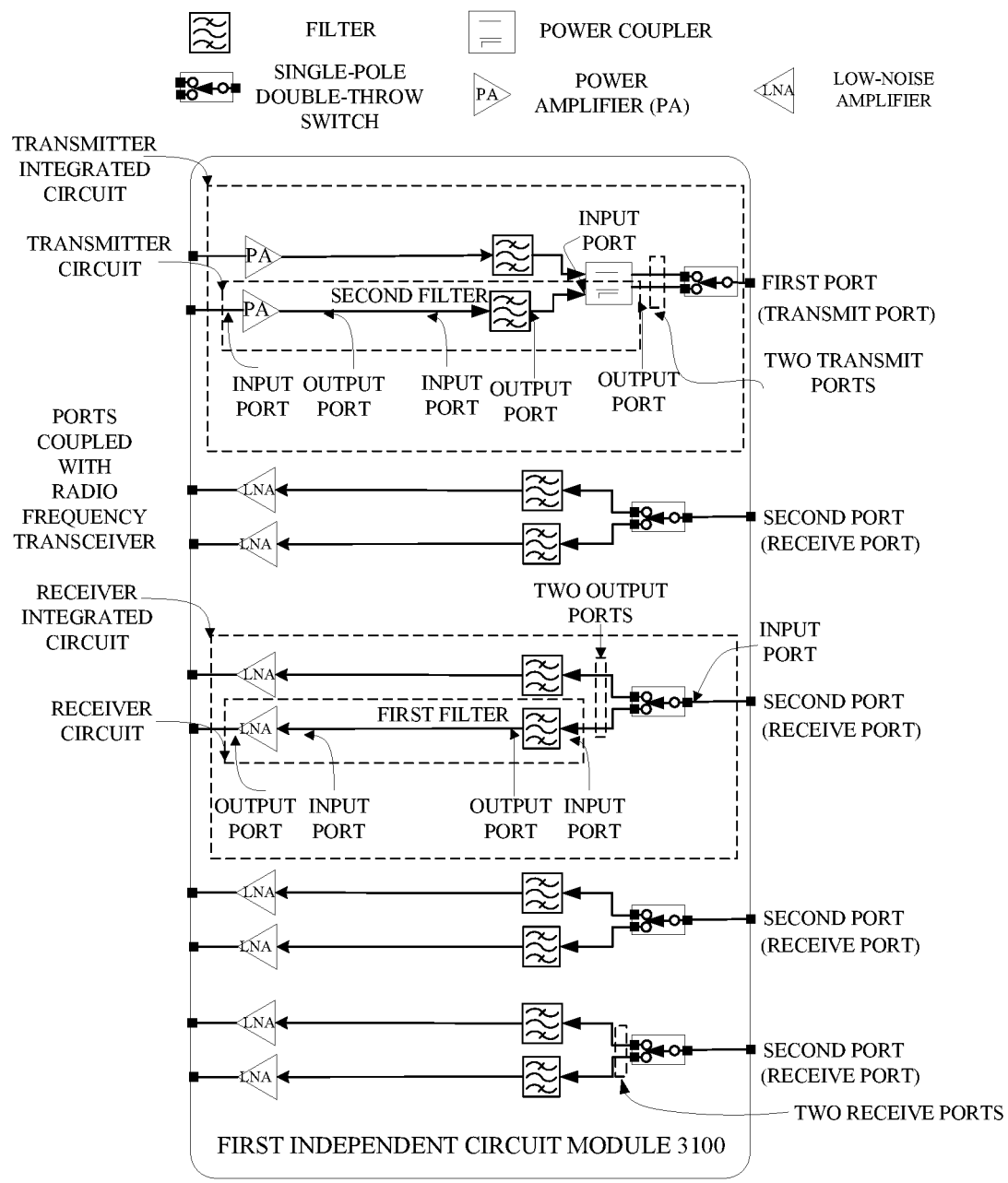
FIG. 3 is a schematic structural diagram illustrating a radio frequency circuit including one independent circuit module according to an implementation of the present disclosure.

As illustrated in FIG. 3, the radio frequency circuit includes one first independent circuit module 3100. Since the dual-frequency single-transmit mode is supported in the disclosure, the two transmitter circuits belong to different frequency bands, and PAs of the two transmitter circuits cannot work at the same time. As a result, the two transmitter circuits at different frequency bands can be provided in the same independent circuit module.

It should be noted that, the two transmitter circuits of the transmitter integrated circuit are operable at different frequency bands, and the two receiver circuits of each receiver integrated circuit are operable at different frequency bands.

In this implementation, for the electronic device operable in the dual-frequency single-transmit mode, the radio frequency circuit adapted to the multiway switch physically includes one independent circuit module, which is beneficial to reducing the use of electronic components, thereby simplifying the structure and reducing cost.

In one possible implementation, the radio frequency circuit of the electronic device logically includes two transmitter circuits and eight receiver circuits. The radio frequency circuit physically includes two independent circuit modules. The two independent circuit modules have one transmit port and multiple receive ports, the transmit port is configured to be coupled with the first T port, and each receive port is configured to be coupled with a corresponding second T port, that is, the multiple receive ports are configured to be coupled with multiple second T ports in one-to-one correspondence.

In this implementation, the radio frequency circuit physically includes two independent circuit modules, and each of the two independent circuit modules has a variety of possible configurations, which is beneficial to improving the diversity and flexibility of the physical configuration of the radio frequency circuit.

In one possible implementation, the two independent circuit modules are embodied as one first independent circuit module 4100 and one second independent circuit module 4200. The first independent circuit module 4100 includes one first port configured to be coupled with the first T port of the multiway switch. The second independent circuit module 4200 includes multiple second ports, and each second port is configured to be coupled with a corresponding second T port of the multiway switch (that is, one of the four second T ports of the multiway switch).

The first independent circuit module 4100 includes one transmitter integrated circuit. The transmitter integrated circuit includes two transmitter circuits, and the two transmitter circuits have two transmit ports coupled with the first port of the first independent circuit module 4100.

The second independent circuit module 4200 includes four receiver integrated circuits. Each of the four receiver integrated circuits includes two receiver circuits, and the two receiver circuits have two receive ports coupled with one of the second ports of the second independent circuit module 4200.

Figure 4A:
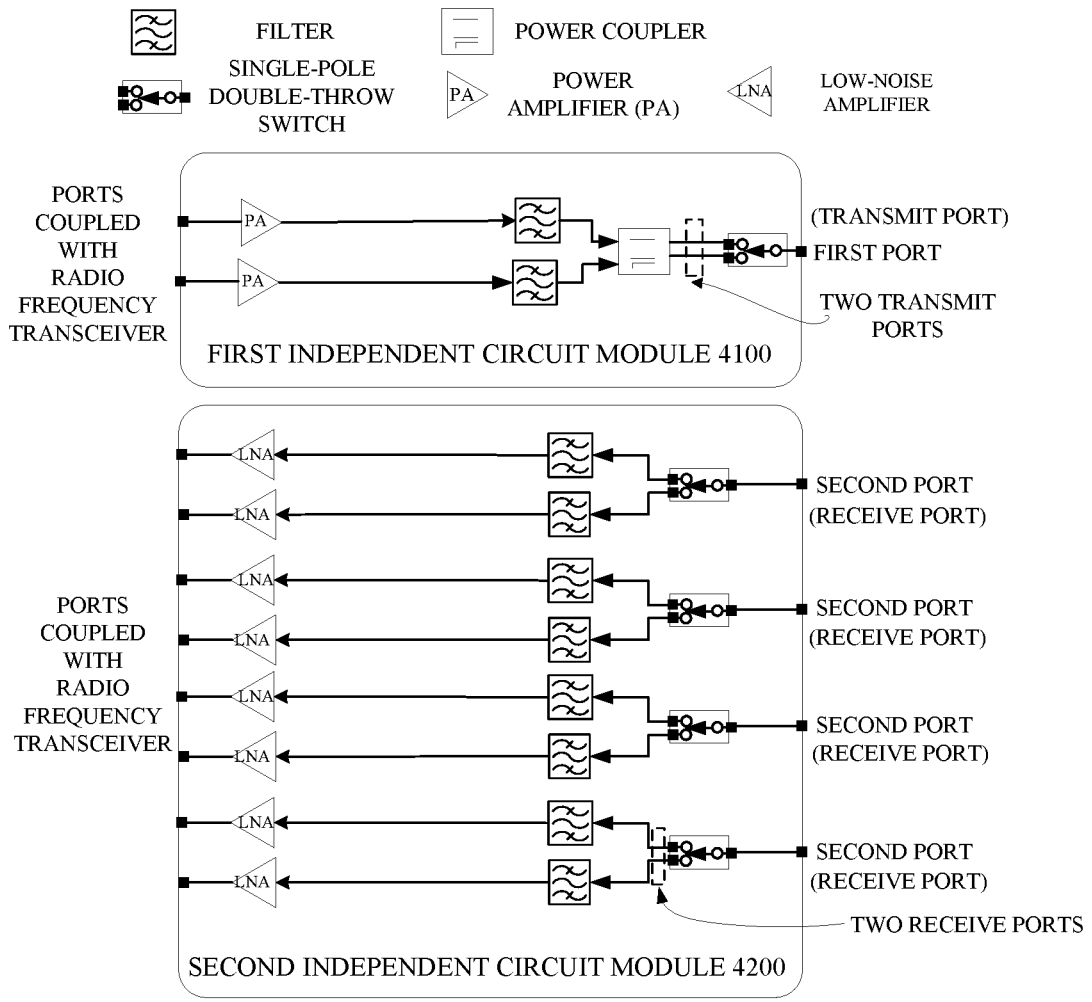
FIG. 4A is a schematic structural diagram illustrating a radio frequency circuit including two independent circuit modules according to an implementation of the present disclosure.

The radio frequency circuit including two independent circuit modules is illustrated in FIG. 4A. The transmitter integrated circuit is disposed in the first independent circuit module 4100 separately, and the four receiver integrated circuits are disposed in the second independent circuit module 4200 collectively.

In this implementation, the radio frequency circuit physically includes two independent circuit modules, and the two independent circuit modules are respectively configured with different types of processing circuits, which is beneficial to simplifying the radio frequency circuit and improving the reusability of different types of processing circuits.

In one possible implementation, the two independent circuit modules are embodied as one first independent circuit module 4300 and one second independent circuit module 4400. The first independent circuit module 4300 includes one first port and multiple second ports, the first port is configured to be coupled with the first T port of the multiway switch, and each second port of the first independent circuit module 4300 is configured to be coupled with a corresponding second T port of the multiway switch (that is, one of the four second T ports of the multiway switch). The second independent circuit module 4400 includes multiple second ports, and each second port is configured to be coupled with a corresponding second T port of the multiway switch (that is, one of the four second T ports of the multiway switch).

The first independent circuit module 4300 includes one transmitter integrated circuit and two receiver integrated circuits. The transmitter integrated circuit includes two transmitter circuits, and the two transmitter circuits have two transmit ports coupled with the first port of the first independent circuit module 4300. Each receiver integrated circuit of the first independent circuit module 4300 includes two receiver circuits, and the two receiver circuits have two receive ports coupled with one of the second ports of the first independent circuit module 4300.

The second independent circuit module 4400 includes two receiver integrated circuits. Each receiver integrated circuit of the second independent circuit module 4400 includes two receiver circuits, and the two receiver circuits have two receive ports coupled with one of the second ports of the second independent circuit module 4400.

Figure 4B:
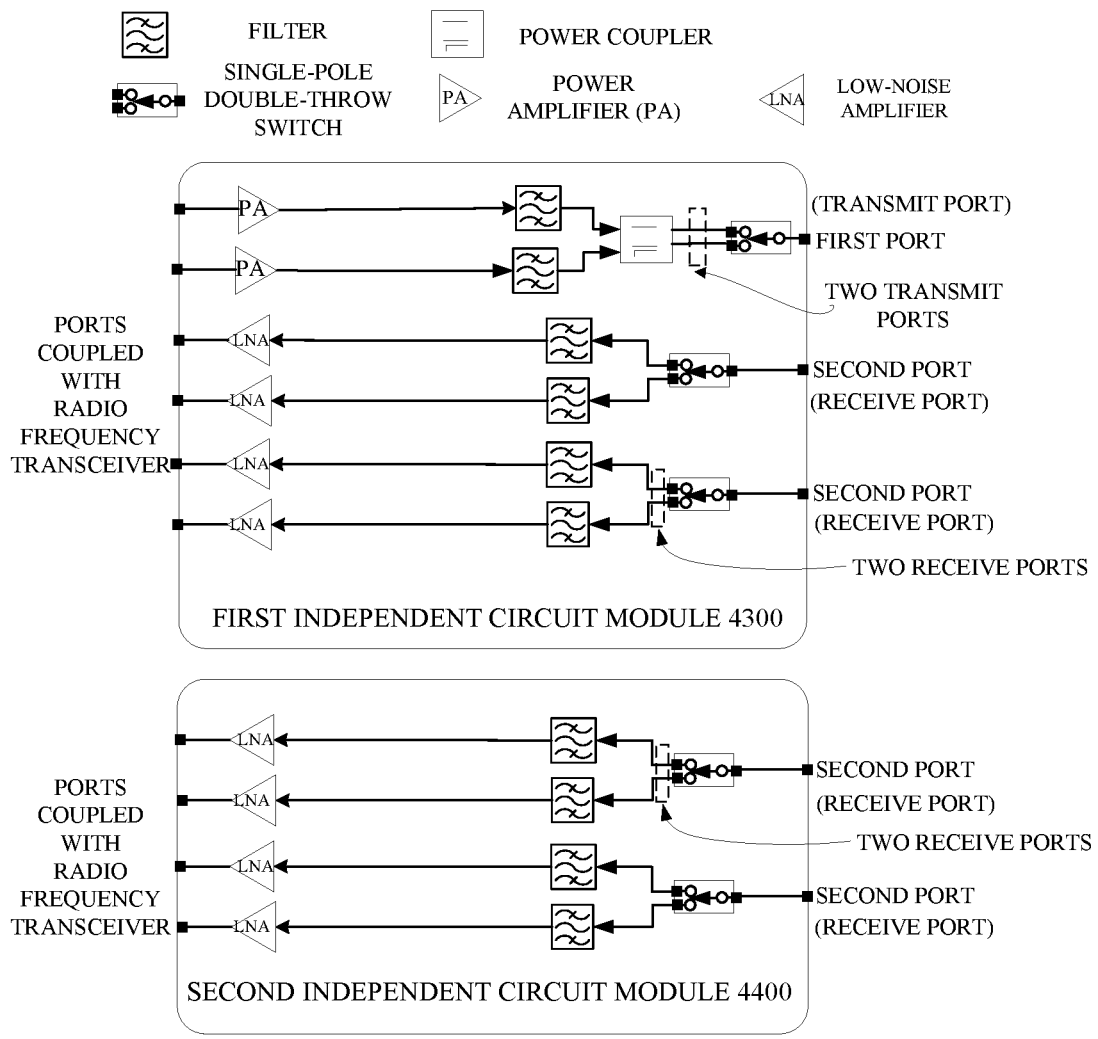
FIG. 4B is a schematic structural diagram illustrating another radio frequency circuit including two independent circuit modules according to an implementation of the present disclosure.

The radio frequency circuit including two independent circuit modules is illustrated in FIG. 4B. Each of the two independent circuit modules is configured with two receiver integrated circuits.

In this implementation, the radio frequency circuit physically includes two independent circuit modules, and the two independent circuit modules have the same number of receiver integrated circuits, which is beneficial to realizing the symmetrical structure of physical form of the radio frequency circuit and simplifying of the structure of the radio frequency circuit.

In one possible implementation, the two independent circuit modules are embodied as one first independent circuit module 4500 and one second independent circuit module 4600. The first independent circuit module 4500 includes one first port and one second port, the first port is configured to be coupled with the first T port of the multiway switch, and the second port of the first independent circuit module 4500 is configured to be coupled with a corresponding second T port of the multiway switch (that is, one of the four second T ports of the multiway switch). The second independent circuit module 4600 includes multiple second ports, and each second port of the second independent circuit module 4600 is configured to be coupled with a corresponding second T port of the multiway switch (that is, one of the four second T ports of the multiway switch).

The first independent circuit module 4500 includes one transmitter integrated circuit and one receiver integrated circuit. The transmitter integrated circuit includes two transmitter circuits, and the two transmitter circuits have two transmit ports coupled with the first port of the first independent circuit module 4500. The receiver integrated circuit of the first independent circuit module 4500 includes two receiver circuits, and the two receiver circuits have two receive ports coupled with the second port of the first independent circuit module 4500.

The second independent circuit module 4600 includes three receiver integrated circuits. Each receiver integrated circuit of the second independent circuit module 4600 includes two receiver circuits, and the two receiver circuits have two receive ports coupled with one of the second ports of the second independent circuit module 4600.

Figure 4C:
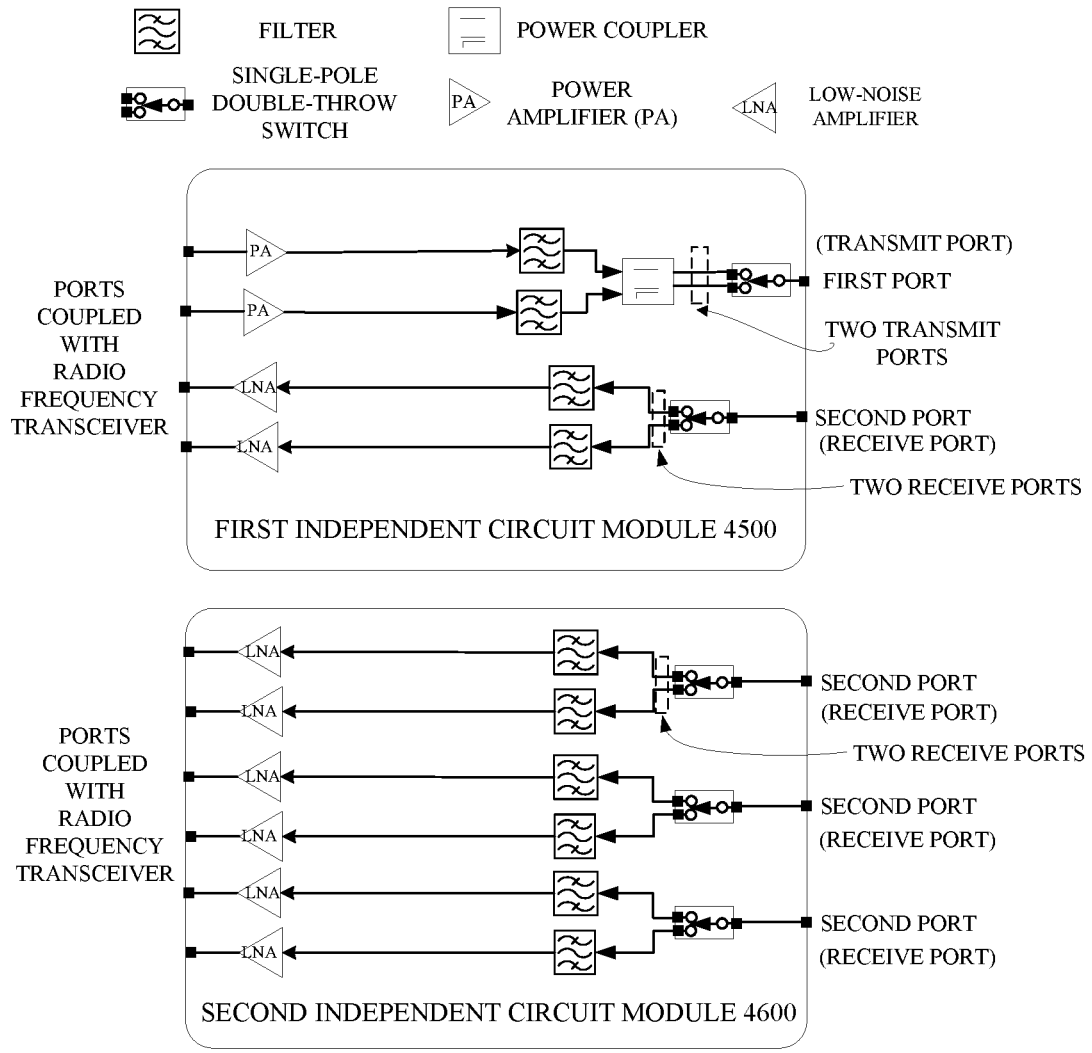
FIG. 4C is a schematic structural diagram illustrating yet another radio frequency circuit including two independent circuit modules according to an implementation of the present disclosure.

The radio frequency circuit including two independent circuit modules is illustrated in FIG. 4C. The two independent circuit modules have an approximate number of processing circuits and an approximate number of ports.

In this implementation, the radio frequency circuit physically includes two independent circuit modules, and the number of processing circuits and the number of ports are both approximate in the two independent circuit modules, which is beneficial to reducing the volume of each independent circuit module and the number of switches of each independent circuit module.

In one possible implementation, the two independent circuit modules are embodied as one first independent circuit module 4700 and one second independent circuit module 4800. The first independent circuit module 4700 includes one first port and multiple second ports, the first port is configured to be coupled with the first T port of the multiway switch, and each second port of the first independent circuit module 4700 is configured to be coupled with a corresponding second T port of the multiway switch (that is, one of the four second T ports of the multiway switch). The second independent circuit module 4800 includes one second port, and the second port of the second independent circuit module 4800 is configured to be coupled with a corresponding second T port of the multiway switch (that is, one of the four second T ports of the multiway switch).

The first independent circuit module 4700 includes one transmitter integrated circuit and three receiver integrated circuits. The transmitter integrated circuit includes two transmitter circuits, and the two transmitter circuits have two transmit ports coupled with the first port of the first independent circuit module 4700. Each receiver integrated circuit of the first independent circuit module 4700 includes two receiver circuits, and the two receiver circuits have two receive ports coupled with one of the second ports of the first independent circuit module 4700.

The second independent circuit module 4800 includes one receiver integrated circuit. The receiver integrated circuit of the second independent circuit module 4800 includes two receiver circuits, and the two receiver circuits have two receive ports coupled with the second port of the second independent circuit module 4800.

Figure 4D:
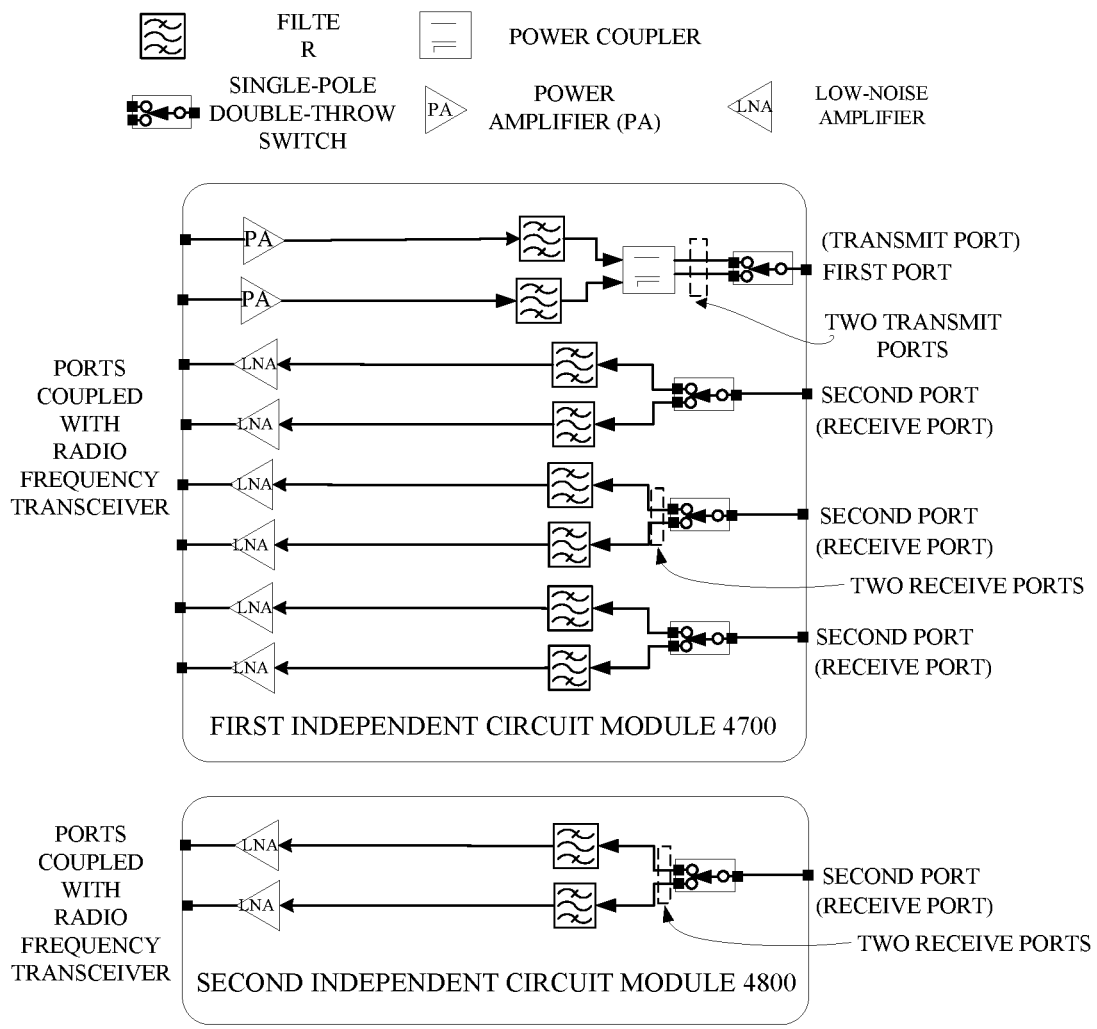
FIG. 4D is a schematic structural diagram illustrating still another radio frequency circuit including two independent circuit modules according to an implementation of the present disclosure.

The radio frequency circuit including two independent circuit modules is illustrated in FIG. 4D. One of the two independent circuit modules only includes one receiver integrated circuit, and the other independent circuit module includes other circuits except one receiver integrated circuit.

In this implementation, the radio frequency circuit physically includes two independent circuit modules, and one of the two independent circuit modules only includes one receiver integrated circuit, which is beneficial to improving the reusability of independent circuit modules, and to improving the convenience and flexibility of the configuration of the radio frequency circuit.

In one possible implementation, the radio frequency circuit of the electronic device logically includes two transmitter circuits and eight receiver circuits. The radio frequency circuit physically includes three independent circuit modules. The three independent circuit modules have one transmit port and multiple receive ports, the transmit port is configured to be coupled with the first T port, and each receive port is configured to be coupled with a corresponding second T port, that is, the multiple receive ports are configured to be coupled with multiple second T ports in one-to-one correspondence.

In this implementation, the radio frequency circuit physically includes three independent circuit modules, and the volume of each independent circuit module is further reduced. Moreover, fewer processing circuits of each independent circuit module will result in a higher reusability of each independent circuit module. Also, it is possible to enhance the adaptability of the installation of each independent circuit module.

In one possible implementation, the three independent circuit modules are embodied as one first independent circuit module 5010, one second independent circuit module 5020, and one third independent circuit module 5030. The first independent circuit module 5010 includes one first port configured to be coupled with the first T port of the multiway switch. The second independent circuit module 5020 and the third independent circuit module 5030 each include multiple second ports, and each second port is configured to be coupled with a corresponding second T port of the multiway switch (that is, one of the four second T ports of the multiway switch).

The first independent circuit module 5010 includes one transmitter integrated circuit. The transmitter integrated circuit includes two transmitter circuits, and the two transmitter circuits have two transmit ports coupled with the first port of the first independent circuit module 5010.

The second independent circuit module 5020 includes two receiver integrated circuits. Each receiver integrated circuit of the second independent circuit module 5020 includes two receiver circuits, and the two receiver circuits have two receive ports coupled with one of the second ports of the second independent circuit module 5020.

The third independent circuit module 5030 includes two receiver integrated circuits. Each receiver integrated circuit of the third independent circuit module 5030 includes two receiver circuits, and the two receiver circuits have two receive ports coupled with one of the second ports of the third independent circuit module 5030.

Figure 5A:
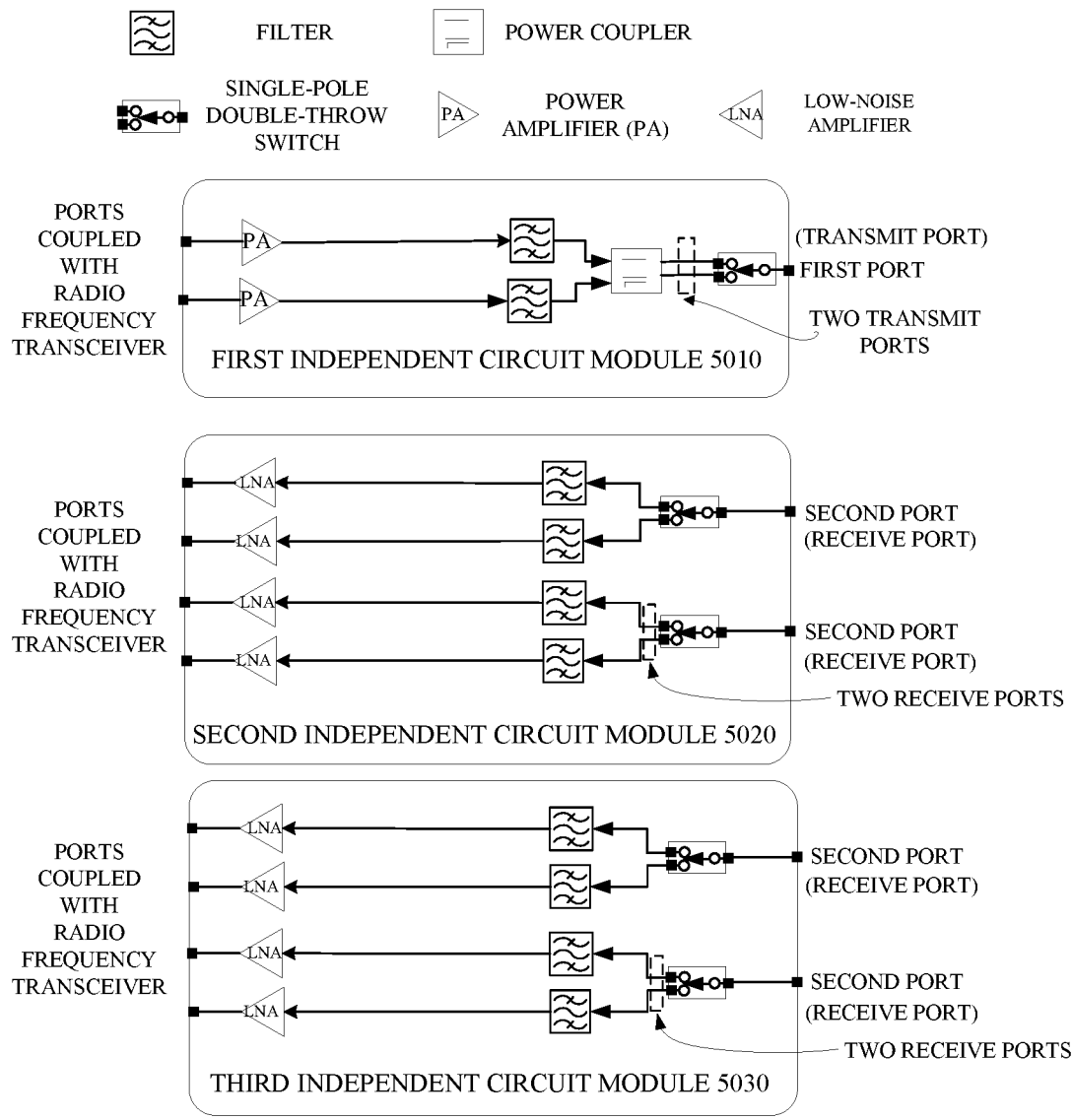
FIG. 5A is a schematic structural diagram illustrating a radio frequency circuit including three independent circuit modules according to an implementation of the present disclosure.

The radio frequency circuit including three independent circuit modules is illustrated in FIG. 5A. The three independent circuit modules include one first independent circuit module 5010, one second independent circuit module 5020, and one third independent circuit module 5030, where the second independent circuit module 5020 and the third independent circuit module 5030 have the same configuration and the first independent circuit module 5010 only includes one transmitter integrated circuit.

In this implementation, the radio frequency circuit physically includes three independent circuit modules, two of the three independent circuit modules have the same configuration, and the first independent circuit module 5010 only includes one transmitter integrated circuit, which is beneficial to improving the reusability of each independent circuit module, and improving the convenience of the production of the radio frequency circuit and the plasticity of the installation of the radio frequency circuit while reducing the volume of each independent circuit module.

In one possible implementation, the three independent circuit modules are embodied as one first independent circuit module 5040, one second independent circuit module 5050, and one third independent circuit module 5060. The first independent circuit module 5040 includes one first port configured to be coupled with the first T port of the multiway switch. The second independent circuit module 5050 includes one second port and the third independent circuit module 5060 includes multiple second ports, and each second port is configured to be coupled with a corresponding second T port of the multiway switch (that is, one of the four second T ports of the multiway switch).

The first independent circuit module 5040 includes one transmitter integrated circuit. The transmitter integrated circuit includes two transmitter circuits, and the two transmitter circuits have two transmit ports coupled with the first port of the first independent circuit module 5040.

The second independent circuit module 5050 includes one receiver integrated circuit. The receiver integrated circuit of the second independent circuit module 5050 includes two receiver circuits, and the two receiver circuits have two receive ports coupled with the second port of the second independent circuit module 5050.

The third independent circuit module 5060 includes three receiver integrated circuits. Each receiver integrated circuit of the third independent circuit module 5060 includes two receiver circuits, and the two receiver circuits have two receive ports coupled with one of the second ports of the third independent circuit module 5060.

Figure 5B:
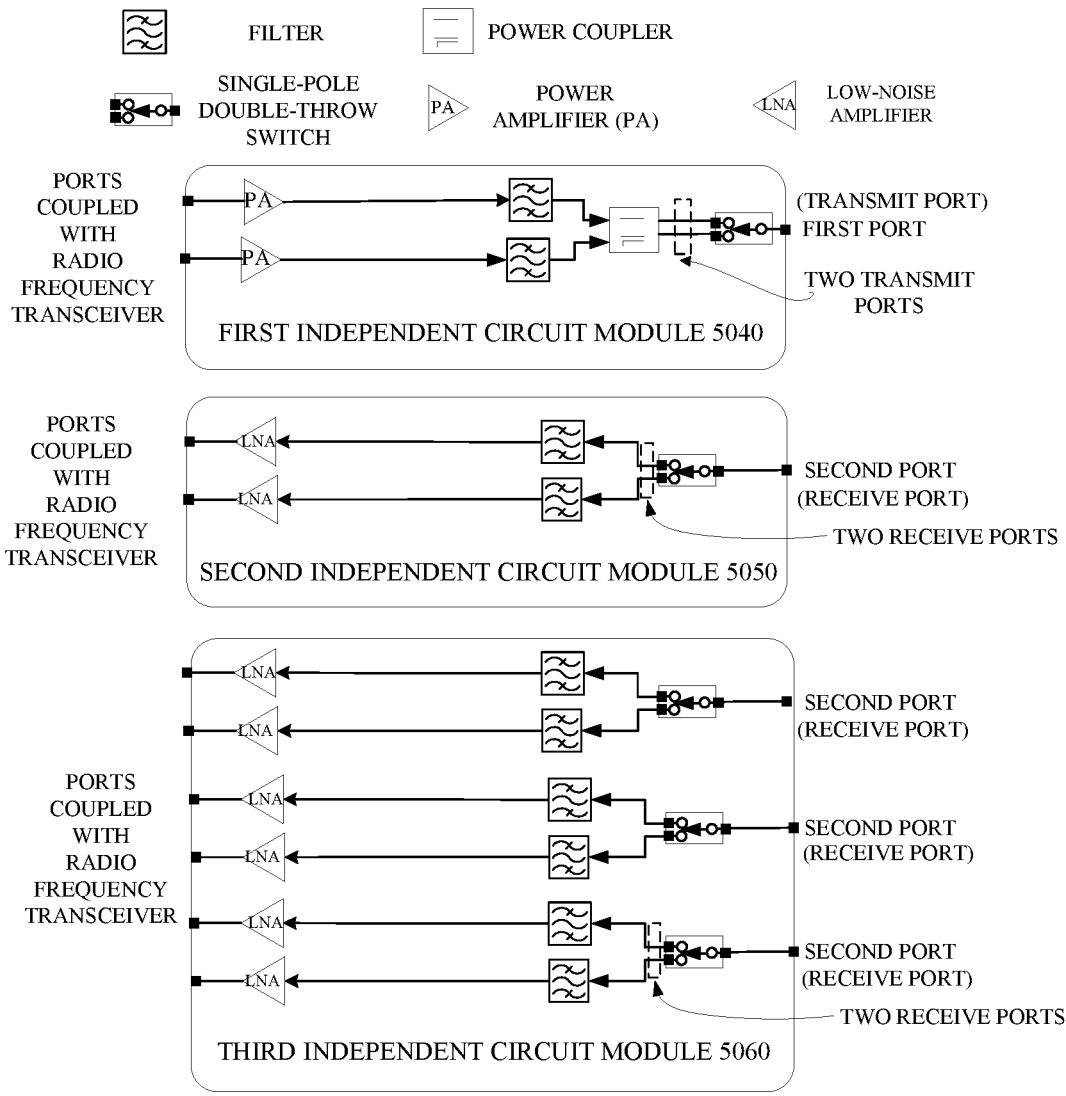
FIG. 5B is a schematic structural diagram illustrating another radio frequency circuit including three independent circuit modules according to an implementation of the present disclosure.

The radio frequency circuit including three independent circuit modules is illustrated in FIG. 5B. The configurations of the three independent circuit modules are different from each other. Moreover, among the three independent circuit modules, there is one independent circuit module including only one receiver integrated circuit and one independent circuit module including only one transmitter integrated circuit.

In this implementation, the radio frequency circuit physically includes three independent circuit modules, and each of the three independent circuit modules has a different configuration, and the three independent circuit modules include one separate receiver integrated circuit and one separate transmitter integrated circuit, which is beneficial to improving the reusability of each independent circuit module and to improving the diversity of the configuration of each independent circuit module.

In one possible implementation, the three independent circuit modules are embodied as one first independent circuit module 5070, one second independent circuit module 5080, and one third independent circuit module 5090. The first independent circuit module 5070 includes one first port and multiple second ports, the first port is configured to be coupled with the first T port of the multiway switch, and each second port is configured to be coupled with a corresponding second T port of the multiway switch (that is, one of the four second T ports of the multiway switch). The second independent circuit module 5080 and the third independent circuit module 5090 each include one second port, and each second port is configured to be coupled with a corresponding second T port of the multiway switch (that is, one of the four second T ports of the multiway switch).

The first independent circuit module 5070 includes one transmitter integrated circuit and two receiver integrated circuits. The transmitter integrated circuit includes two transmitter circuits, and the two transmitter circuits have two transmit ports coupled with the first port of the first independent circuit module 5070. Each receiver integrated circuit of the first independent circuit module 5070 includes two receiver circuits, and the two receiver circuits have two receive ports coupled with one of the second ports of the first independent circuit module 5070.

The second independent circuit module 5080 includes one receiver integrated circuit. The receiver integrated circuit of the second independent circuit module 5080 includes two receiver circuits, and the two receiver circuits have two receive ports coupled with the second port of the second independent circuit module 5080.

The third independent circuit module 5090 includes one receiver integrated circuit. The receiver integrated circuit of the third independent circuit module 5090 includes two receiver circuits, and the two receiver circuits have two receive ports coupled with the second port of the third independent circuit module 5090.

Figure 5C:
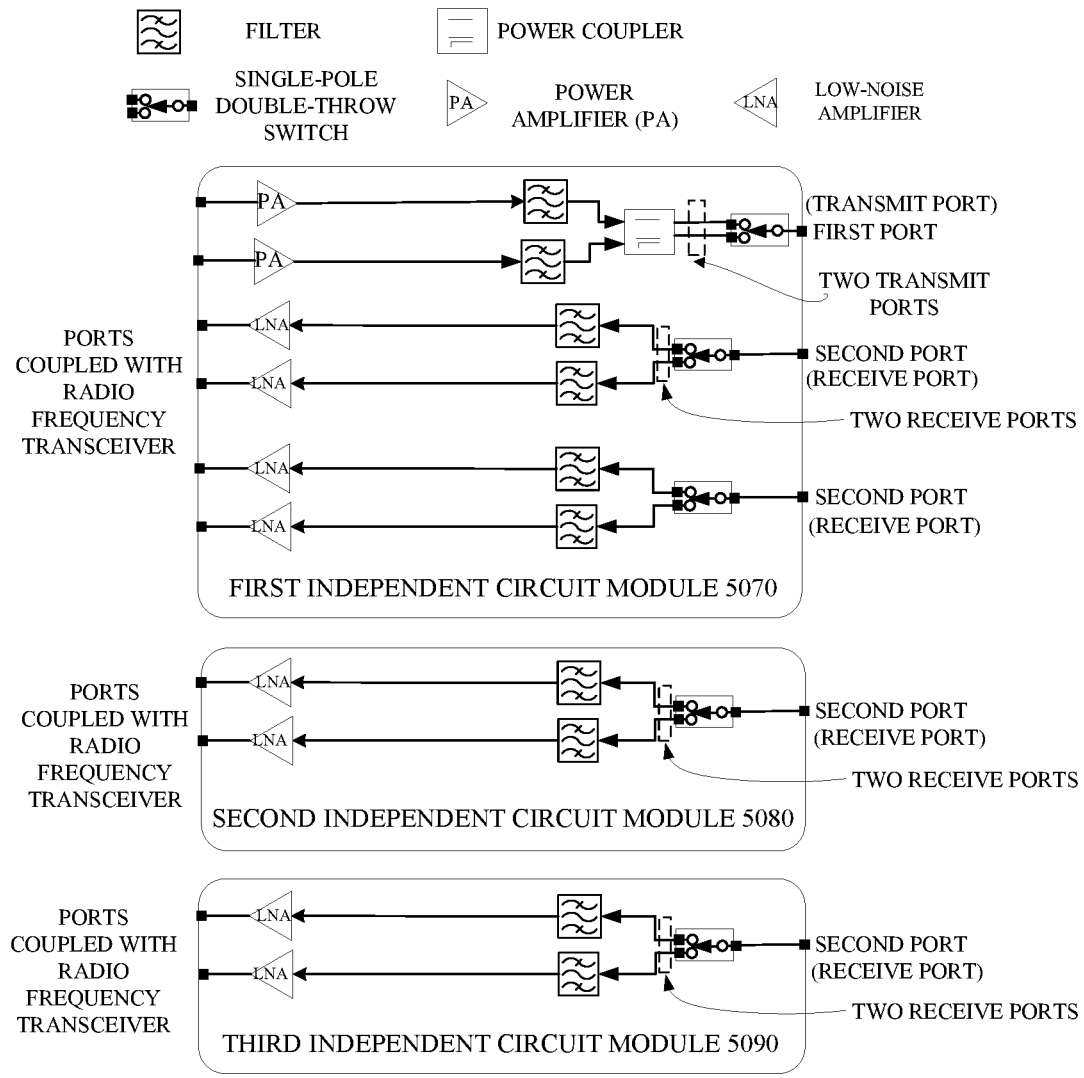
FIG. 5C is a schematic structural diagram illustrating yet another radio frequency circuit including three independent circuit modules according to an implementation of the present disclosure.

The radio frequency circuit including three independent circuit modules is illustrated in FIG. 5C. The three independent circuit modules include one first independent circuit module 5070, one second independent circuit module 5080, and one third independent circuit module 5090, where the second independent circuit module 5080 and the third independent circuit module 5090 have the same configuration.

In this implementation, the radio frequency circuit physically includes three independent circuit modules, and two of the three independent circuit modules have the same configuration, in fact, only two types of independent circuit modules are adopted in the production of the radio frequency circuit, which further improves the simplicity and convenience of the production of the radio frequency circuit.

In one possible implementation, the three independent circuit modules are embodied as one first independent circuit module 5100, one second independent circuit module 5200, and one third independent circuit module 5300. The first independent circuit module 5100 includes one first port and one second port, the first port is configured to be coupled with the first T port of the multiway switch, and the second port is configured to be coupled with a corresponding second T port of the multiway switch (that is, one of the four second T ports of the multiway switch). The second independent circuit module 5200 includes one second port and the third independent circuit module 5300 includes multiple second ports, and each second port is configured to be coupled with a corresponding second T port of the multiway switch (that is, one of the four second T ports of the multiway switch).

The first independent circuit module 5100 includes one transmitter integrated circuit and one receiver integrated circuit. The transmitter integrated circuit includes two transmitter circuits, and the two transmitter circuits have two transmit ports coupled with the first port of the first independent circuit module 5100. The receiver integrated circuit of the first independent circuit module 5100 includes two receiver circuits, and the two receiver circuits have two receive ports coupled with the second port of the first independent circuit module 5100.

The second independent circuit module 5200 includes one receiver integrated circuit. The receiver integrated circuit of the second independent circuit module 5200 includes two receiver circuits, and the two receiver circuits have two receive ports coupled with the second port of the second independent circuit module 5200.

The third independent circuit module 5300 includes two receiver integrated circuits. Each receiver integrated circuit of the third independent circuit module 5300 includes two receiver circuits, and the two receiver circuits have two receive ports coupled with one of the second ports of the third independent circuit module 5300.

Figure 5D:
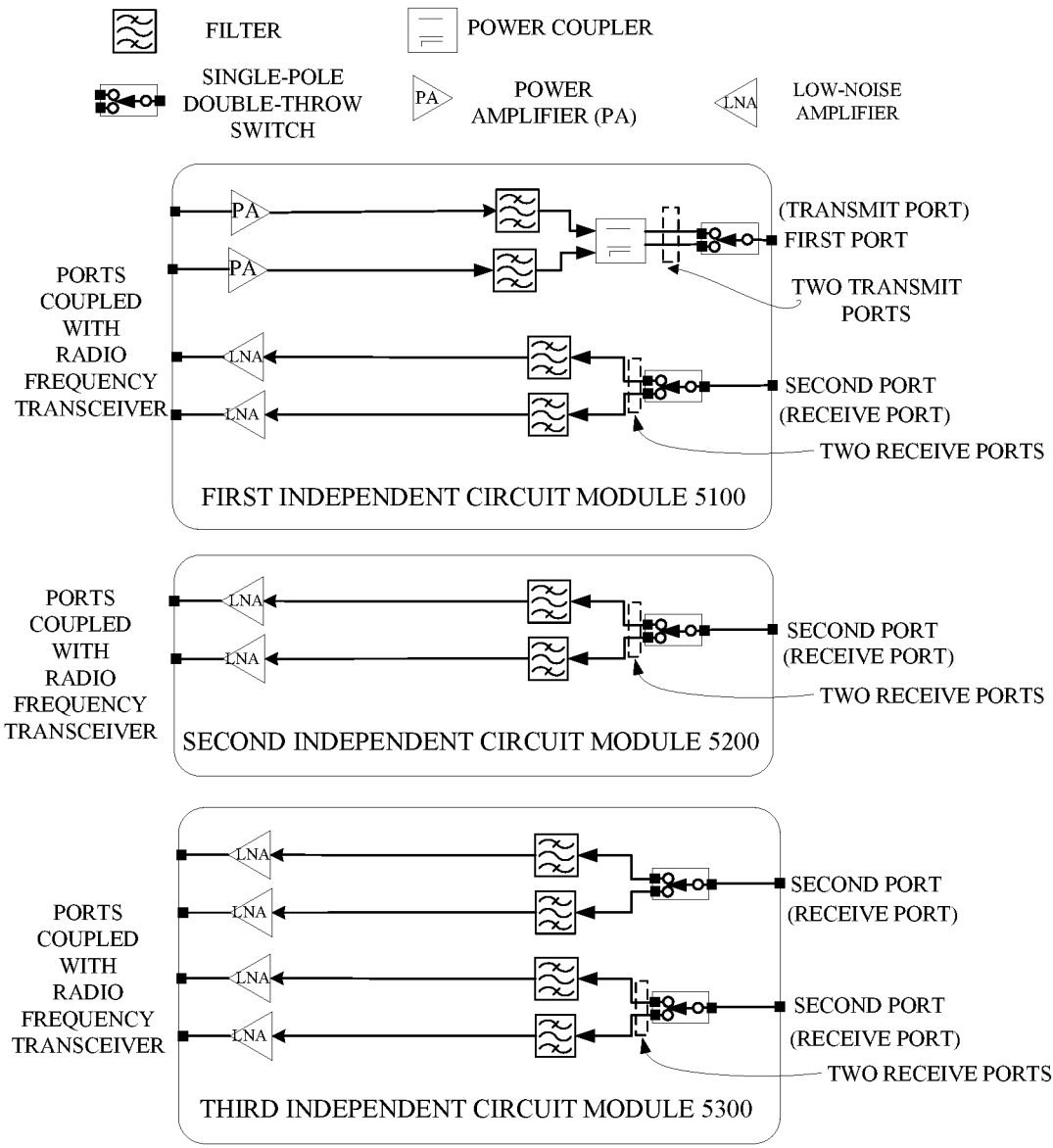
FIG. 5D is a schematic structural diagram illustrating still another radio frequency circuit including three independent circuit modules according to an implementation of the present disclosure.

The radio frequency circuit including three independent circuit modules is illustrated in FIG. 5D. The first independent circuit module 5100, the second independent circuit module 5200, and the third independent circuit module 5300 are different from each other and are composed of different processing circuits.

In this implementation, the radio frequency circuit physically includes three independent circuit modules, and each of the three independent circuit modules has a different configuration, which is beneficial to improving the reusability of each independent circuit module and the diversity of the configuration of each independent circuit module.

In one possible implementation, the radio frequency circuit of the electronic device logically includes two transmitter circuits and eight receiver circuits. The radio frequency circuit physically includes four independent circuit modules. The four independent circuit modules have one transmit port and multiple receive ports, the transmit port is configured to be coupled with the first T port, and each receive port is configured to be coupled with a corresponding second T port, that is, the multiple receive ports are configured to be coupled with multiple second T ports in one-to-one correspondence.

In the implementation, the radio frequency circuit is divided into four independent circuit modules and each independent circuit module can have a volume as small as possible, which is beneficial to improving the diversity of the radio frequency circuit including the four independent circuit modules, and to applying the radio frequency circuit with to various electronic devices.

In one possible implementation, the four independent circuit modules are embodied as one first independent circuit module 6100, one second independent circuit module 6200, one third independent circuit module 6300, and one fourth independent circuit module 6400. The first independent circuit module 6100 includes one first port configured to be coupled with the first T port of the multiway switch. The second independent circuit module 6200 includes multiple second ports, the third independent circuit module 6300 and the fourth independent circuit module 6400 each include one second port, and each second port is configured to be coupled with a corresponding second T port of the multiway switch (that is, one of the four second T ports of the multiway switch).

The first independent circuit module 6100 includes one transmitter integrated circuit. The transmitter integrated circuit includes two transmitter circuits, and the two transmitter circuits have two transmit ports coupled with the first port of the first independent circuit module 6100.

The second independent circuit module 6200 includes two receiver integrated circuits. Each receiver integrated circuit of the second independent circuit module 6200 includes two receiver circuits, and the two receiver circuits have two receive ports coupled with one of the second ports of the second independent circuit module 6200.

The third independent circuit module 6300 includes one receiver integrated circuit. The receiver integrated circuit of the third independent circuit module 6300 includes two receiver circuits, and the two receiver circuits have two receive ports coupled with the second port of the third independent circuit module 6300.

The fourth independent circuit module 6400 includes one receiver integrated circuit. The receiver integrated circuit of the fourth independent circuit module 6400 includes two receiver circuits, and the two receiver circuits have two receive ports coupled with the second port of the fourth independent circuit module 6400.

Figure 6A:
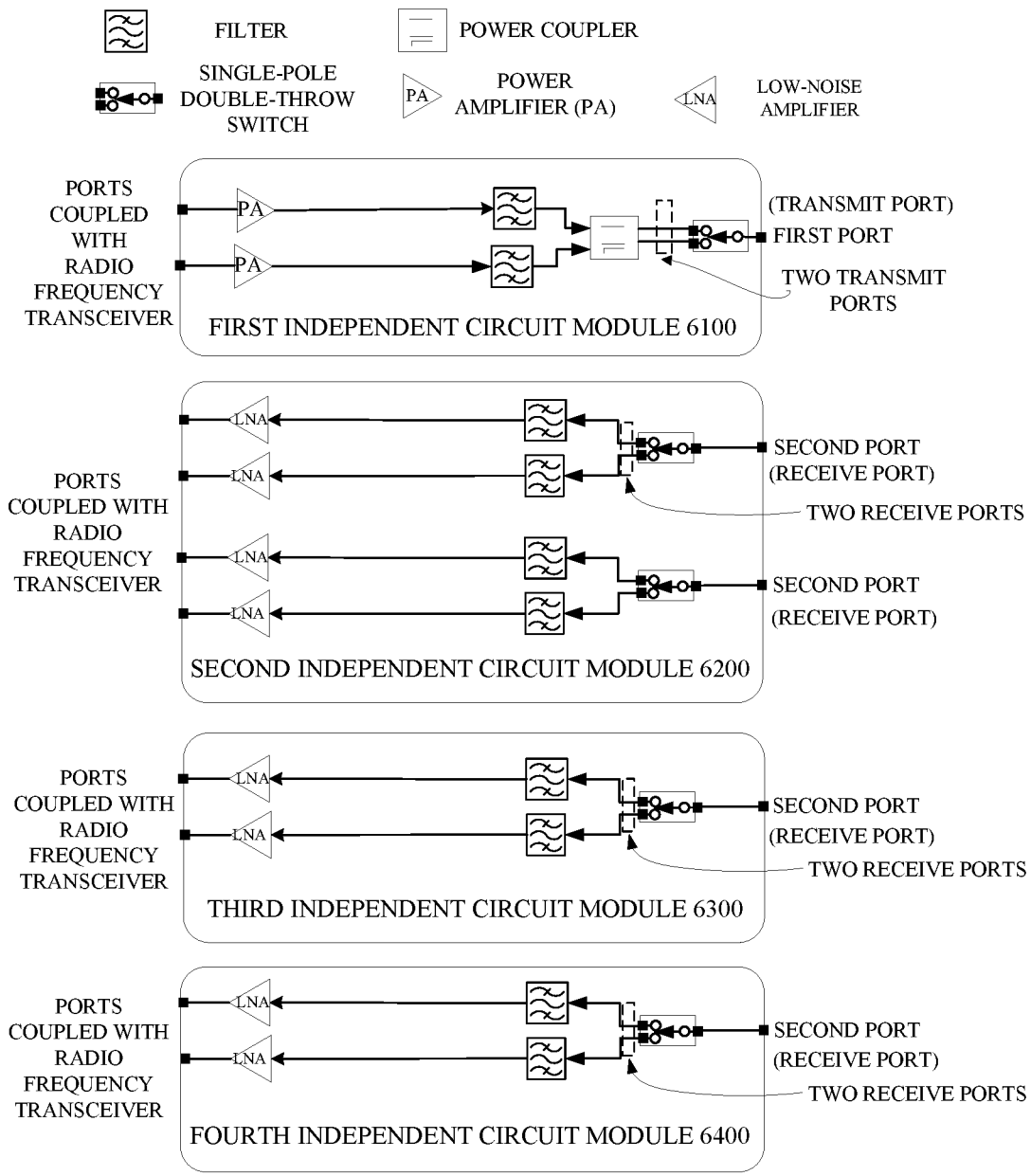
FIG. 6A is a schematic structural diagram illustrating a radio frequency circuit including four independent circuit modules according to an implementation of the present disclosure.

The radio frequency circuit including four independent circuit modules is illustrated in FIG. 6A. The four independent circuit modules include one first independent circuit module 6100, one second independent circuit module 6200, one third independent circuit module 6300, and one fourth independent circuit module 6400, where the third independent circuit module 6300 and the fourth independent circuit module 6400 have the same configuration. Moreover, among the four independent circuit modules, there is one independent circuit module including only one transmitter integrated circuit and independent circuit modules including only one receiver integrated circuit.

In this implementation, the radio frequency circuit physically includes four independent circuit modules, and two of the four independent circuit modules have the same configuration, and three of the four independent circuit modules only include one transmitter integrated circuit or one receiver integrated circuit, which further improves the reusability of a single independent circuit module and simplifies the production of each independent circuit module.

In one possible implementation, the four independent circuit modules are embodied as one first independent circuit module 6500, one second independent circuit module 6600, one third independent circuit module 6700, and one fourth independent circuit module 6800. The first independent circuit module 6500 includes one first port and one second port, the first port is configured to be coupled with the first T port of the multiway switch, and the second port of the first independent circuit module 6500 is configured to be coupled with a corresponding second T port of the multiway switch (that is, one of the four second T ports of the multiway switch). The second independent circuit module 6600, the third independent circuit module 6700, and the fourth independent circuit module 6800 each include one second port, and each second port is configured to be coupled with a corresponding second T port of the multiway switch (that is, one of the four second T ports of the multiway switch).

The first independent circuit module 6500 includes one transmitter integrated circuit and one receiver integrated circuit. The transmitter integrated circuit includes two transmitter circuits, and the two transmitter circuits have two transmit ports coupled with the first port of the first independent circuit module 6500. The receiver integrated circuit of the first independent circuit module 6500 includes two receiver circuits, and the two receiver circuits have two receive ports coupled with the second port of the first independent circuit module 6500.

The second independent circuit module 6600 includes one receiver integrated circuit. The receiver integrated circuit of the second independent circuit module 6600 includes two receiver circuits, and the two receiver circuits have two receive ports coupled with the second port of the second independent circuit module 6600.

The third independent circuit module 6700 includes one receiver integrated circuit. The receiver integrated circuit of the third independent circuit module 6700 includes two receiver circuits, and the two receiver circuits have two receive ports coupled with the second port of the third independent circuit module 6700.

The fourth independent circuit module 6800 includes one receiver integrated circuit. The receiver integrated circuit of the fourth independent circuit module 6800 includes two receiver circuits, and the two receiver circuits have two receive ports coupled with the second port of the fourth independent circuit module 6800.

Figure 6B:
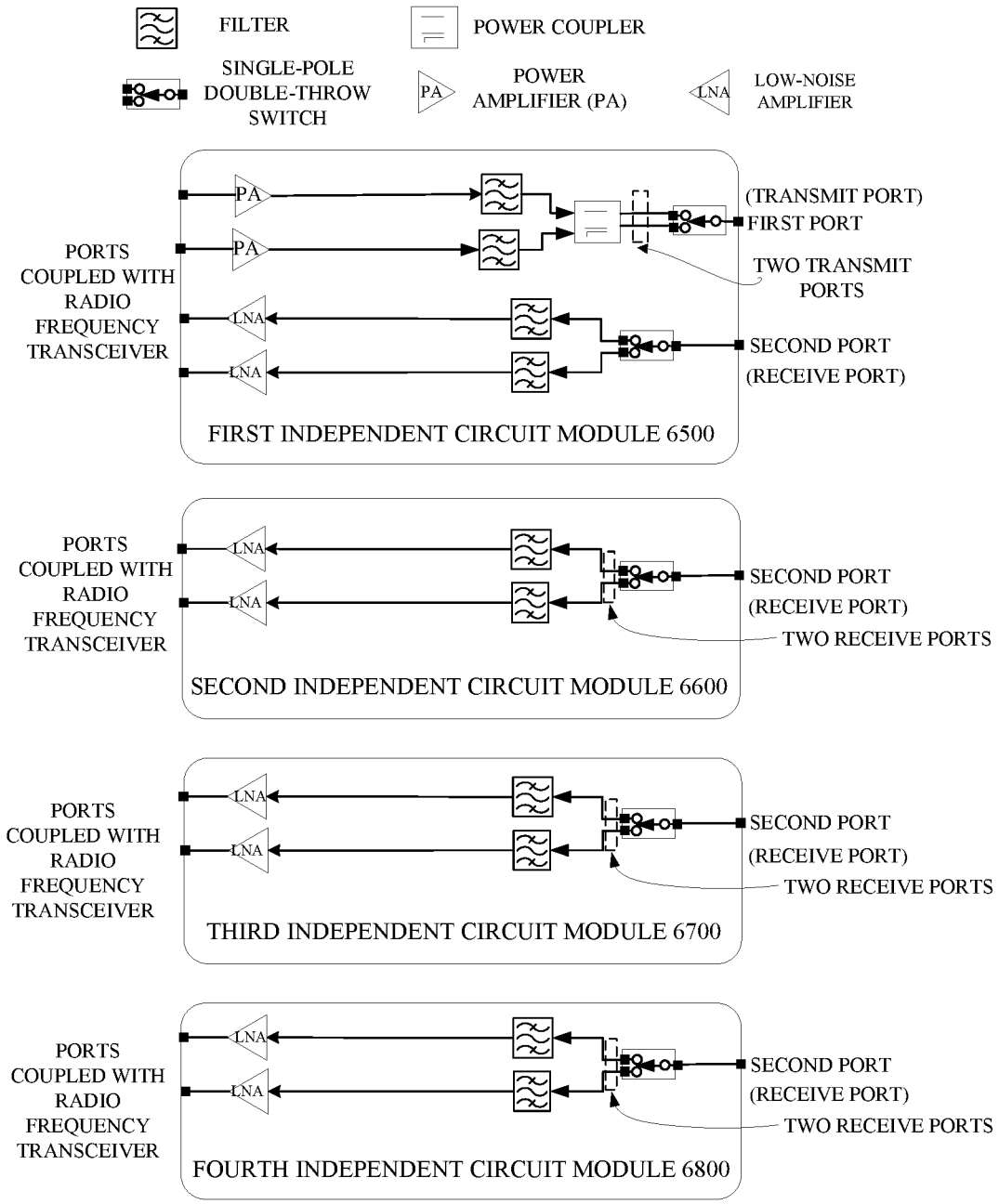
FIG. 6B is a schematic structural diagram illustrating another radio frequency circuit including four independent circuit modules according to an implementation of the present disclosure.

The radio frequency circuit including four independent circuit modules is illustrated in FIG. 6B. The four independent circuit modules include one first independent circuit module 6500, one second independent circuit module 6600, one third independent circuit module 6700, and one fourth independent circuit module 6800, where the second independent circuit module 6600, the third independent circuit module 6700, and the fourth independent circuit module 6800 have the same configuration.

In this implementation, the radio frequency circuit physically includes four independent circuit modules, and three of the four independent circuit modules have the same configuration, in fact, only two types of independent circuit modules are adopted in the production of the radio frequency circuit, which improves the simplicity and convenience of the production of each independent circuit module.

In one possible implementation, the radio frequency circuit of the electronic device logically includes two transmitter circuits and eight receiver circuits. The radio frequency circuit physically includes five independent circuit modules. The five independent circuit modules have one transmit port and multiple receive ports, the transmit port is configured to be coupled with the first T port, and each receive port is configured to be coupled with a corresponding second T port, that is, the multiple receive ports are configured to be coupled with multiple second T ports in one-to-one correspondence.

In this implementation, the radio frequency circuit is divided into five independent circuit modules, and each independent circuit module can have a volume as small as possible, which is beneficial to increasing the diversity of the radio frequency circuit including the five independent circuit modules, and it is possible to adapt the radio frequency circuit to more kinds of electronic devices.

In one possible implementation, the five independent circuit modules are embodied as one first independent circuit module 7100, one second independent circuit module 7200, one third independent circuit module 7300, one fourth independent circuit module 7400, and one fifth independent circuit module 7500. The first independent circuit module 7100 includes one first port configured to be coupled with the first T port of the multiway switch. The second independent circuit module 7200, the third independent circuit module 7300, the fourth independent circuit module 7400, and fifth independent circuit module 7500 each include one second port, and each second port is configured to be coupled with a corresponding second T port of the multiway switch (that is, one of the four second T ports of the multiway switch).

The first independent circuit module 7100 includes one transmitter integrated circuit. The transmitter integrated circuit includes two transmitter circuits, and the two transmitter circuits have two transmit ports coupled with the first port of the first independent circuit module 7100.

The second independent circuit module 7200 includes one receiver integrated circuit. The receiver integrated circuit of the second independent circuit module 7200 includes two receiver circuits, and the two receiver circuits have two receive ports coupled with the second port of the second independent circuit module 7200.

The third independent circuit module 7300 includes one receiver integrated circuit. The receiver integrated circuit of the third independent circuit module 7300 includes two receiver circuits, and the two receiver circuits have two receive ports coupled with the second port of the third independent circuit module 7300.

The fourth independent circuit module 7400 includes one receiver integrated circuit. The receiver integrated circuit of the fourth independent circuit module 7400 includes two receiver circuits, and the two receiver circuits have two receive ports coupled with the second port of the fourth independent circuit module 7400.

The fifth independent circuit module 7500 includes one receiver integrated circuit. The receiver integrated circuit of the fifth independent circuit module 7500 includes two receiver circuits, and the two receiver circuits have two receive ports coupled with the second port of the fifth independent circuit module 7500.

Figure 7:
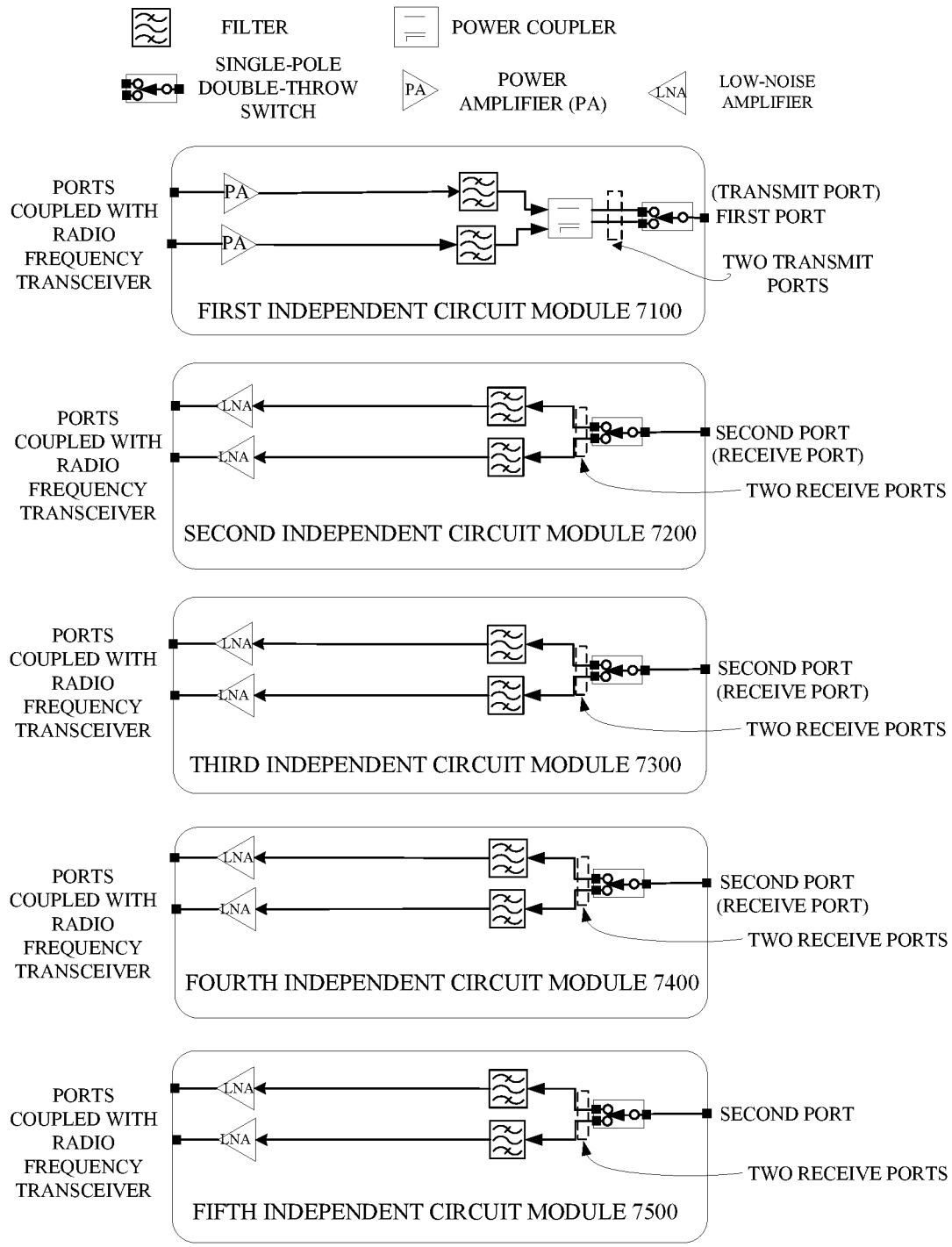
FIG. 7 is a schematic structural diagram illustrating a radio frequency circuit including five independent circuit modules according to an implementation of the present disclosure.

The radio frequency circuit including five independent circuit modules is illustrated in FIG. 7. The five independent circuit modules include one first independent circuit module 7100, one second independent circuit module 7200, one third independent circuit module 7300, one fourth independent circuit module 7400, and one fifth independent circuit module 7500, where the second independent circuit module, the third independent circuit module 7300, the fourth independent circuit module 7400, and the fifth independent circuit module 7500 have the same configuration, and only one type of processing circuit is included in each independent circuit module.

In this implementation, the radio frequency circuit physically includes five independent circuit modules, and four of the five independent circuit modules have the same configuration, thus, in fact, only two types of independent circuit modules are adopted in making the radio frequency circuit. Moreover, a minimum number of processing circuits are included in each independent circuit module, and the volume of the independent circuit module is reduced to a minimum volume, which further improves the simplicity and convenience of the radio frequency circuit making.

Figure 8:
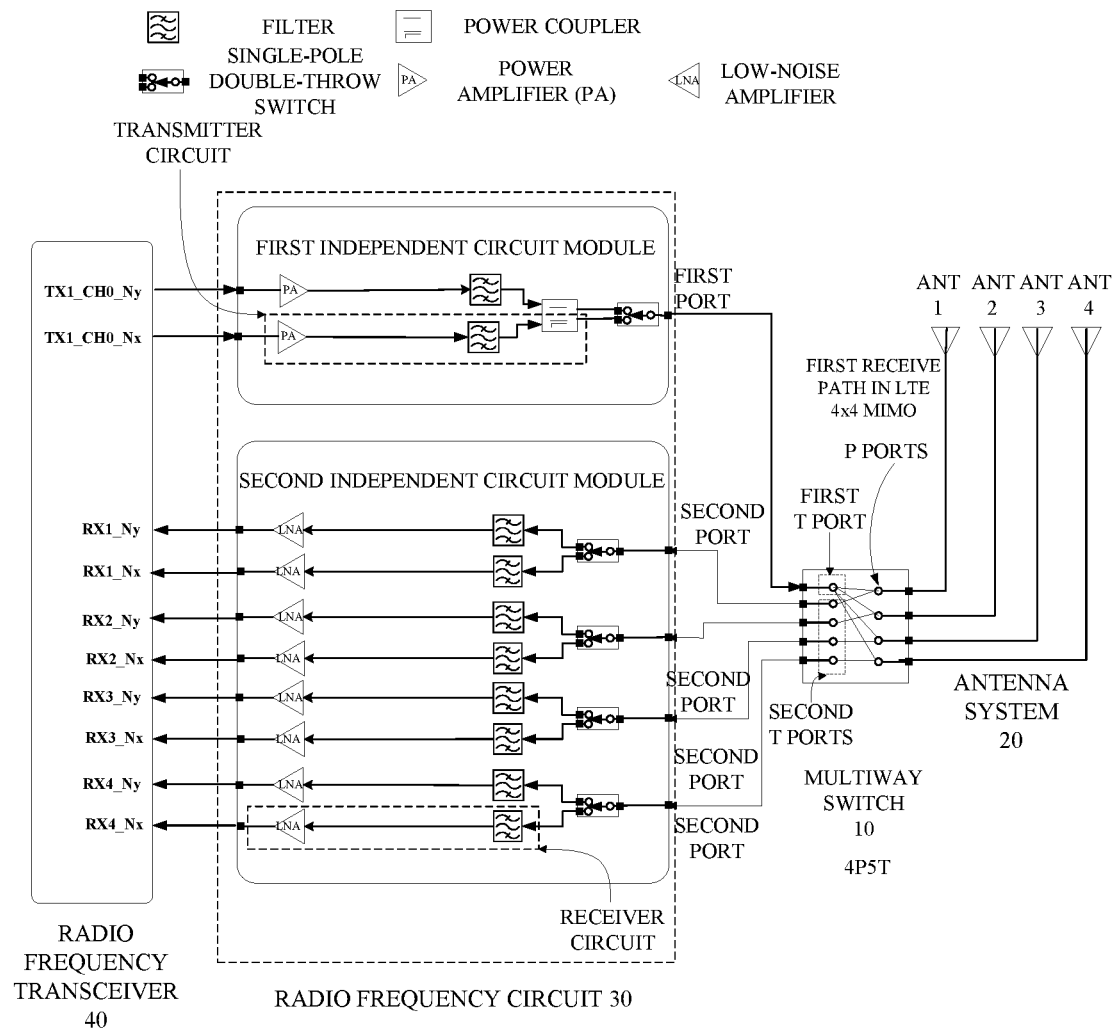
FIG. 8 is a schematic structural diagram illustrating an overall architecture of a radio frequency system of an electronic device according to an implementation of the present disclosure.

For example, the overall architecture of the radio frequency system of an electronic device is illustrated in FIG. 8. When the electronic device transmits data through a frequency band Nx, the working process of the radio frequency system is as follows. A radio frequency transceiver 40 sends, through a transmit port TX1_CH0_Nx at the frequency band Nx, a transmit signal to a PA of a first independent circuit module coupled with the transmit port TX1_CH0_Nx. The PA sends the transmit signal received to a first port of the first independent circuit module through a filter and a power coupler of a transmitter circuit. Due to the fact that a first T port of the multiway switch 10 with which the first port is coupled is a full coupled port supporting a signal transmission function, the first port can send four transmit signals to four P ports through the first T port of the multiway switch 10 in the same time period. In this situation, the four P ports transmit the four transmit signals through antennas corresponding to each P port, to transmit four channels of data to external devices simultaneously.

Similarly, when the electronic device receives data through a frequency band Ny, the working process of the radio frequency system is as follows. The four antennas send four receive signals respectively to the four P ports of the multiway switch 10 in the same time period. The four P ports send the four receive signals respectively to four second T ports of the multiway switch 10, where the four second T ports support a reception function. Each of the four second T ports receives one receive signal from each of the four P ports. Each of the four second T ports sends, through a second port of a second independent circuit module, the receive signal to each of four receiver circuits, where each receiver circuit corresponds to a receive port of a frequency band Ny of the radio frequency transceiver 40. Each receiver circuit sends the receive signal received to the receive port of the frequency band Ny of the radio frequency transceiver 40 (that is, the receive ports of the frequency band Ny are Rx1_Ny, RX2_Ny, RX3_Ny, RX4_Ny respectively) through an LNA and a filter, thereby implementing four receive-signal paths of the electronic device.

It may be understood that circuits of an independent circuit module may be diverse and will not be uniquely limited to the implementations of the present disclosure. The following provides some possible implementations.

In one possible implementation, the receiver circuit includes an LNA and a first filter. The first filter has an input port coupled with a corresponding second port of an independent circuit module, the first filter has an output port coupled with an input port of the LNA, and the LNA has an output port coupled with a corresponding port of a radio frequency transceiver.

In one possible implementation, the transmitter circuit includes a PA, a second filter, and a power coupler. The PA has an input port coupled with a corresponding port of the RF transceiver, the PA has an output port coupled with an input port of the second filter, the second filter has an output port coupled with an input port of the power coupler, and the power coupler has an output port coupled with the first port of an independent circuit module.

In one possible implementation, the receiver integrated circuit including two receiver circuits operable at different frequency bands and integrated through a switch of the receiver integrated circuit. The switch of the receiver integrated circuit has an input port and two output ports, the input port of the switch of the receiver integrated circuit is coupled with a corresponding second port of an independent circuit module, and each of the two output ports of the switch of the receiver integrated circuit is coupled with one of two input ports of two first filters of the two receiver circuits.

In one possible implementation, the transmitter integrated circuit includes two transmitter circuits operable at different frequency bands and sharing the input port of the power coupler, and the power coupler has the output port coupled with the first port of an independent circuit module through a switch of the transmitter integrated circuit.

Figure 9:
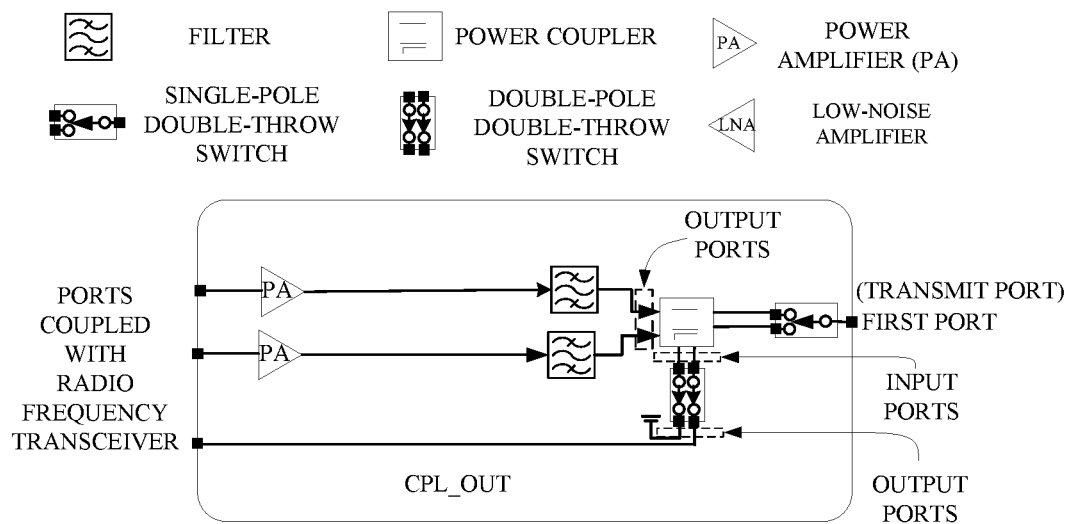
FIG. 9 is a schematic structural diagram illustrating a transmitter integrated circuit of a radio frequency circuit according to an implementation of the present disclosure.

The transmitter circuit may further include multiple control circuits. For example, as illustrated in FIG. 9, an independent circuit module including one transmitter integrated circuit is provided. The transmitter integrated circuit can further include a double-pole double-throw (DPDT) switch. Filters of the transmitter integrated circuit have output ports coupled with input ports of the DPDT switch. The DPDT switch has output ports, one end of the output ports of the DPDT switch is grounded and the other end of the output ports of the DPDT switch is coupled with a coupling output port CPL_OUT, to detect output power of PAs.

In this implementation, although the radio frequency circuit can have various physical forms, it can include part or all of these five types of processing circuits. Moreover, the structures of the five types of processing circuits are simple and require fewer circuit components, which is advantageous for simplifying the radio frequency circuit.

In one possible implementation, the multiway switch is composed of field-effect transistors (FETs), and the multiway includes thirty-three FETs.

Figure 10:
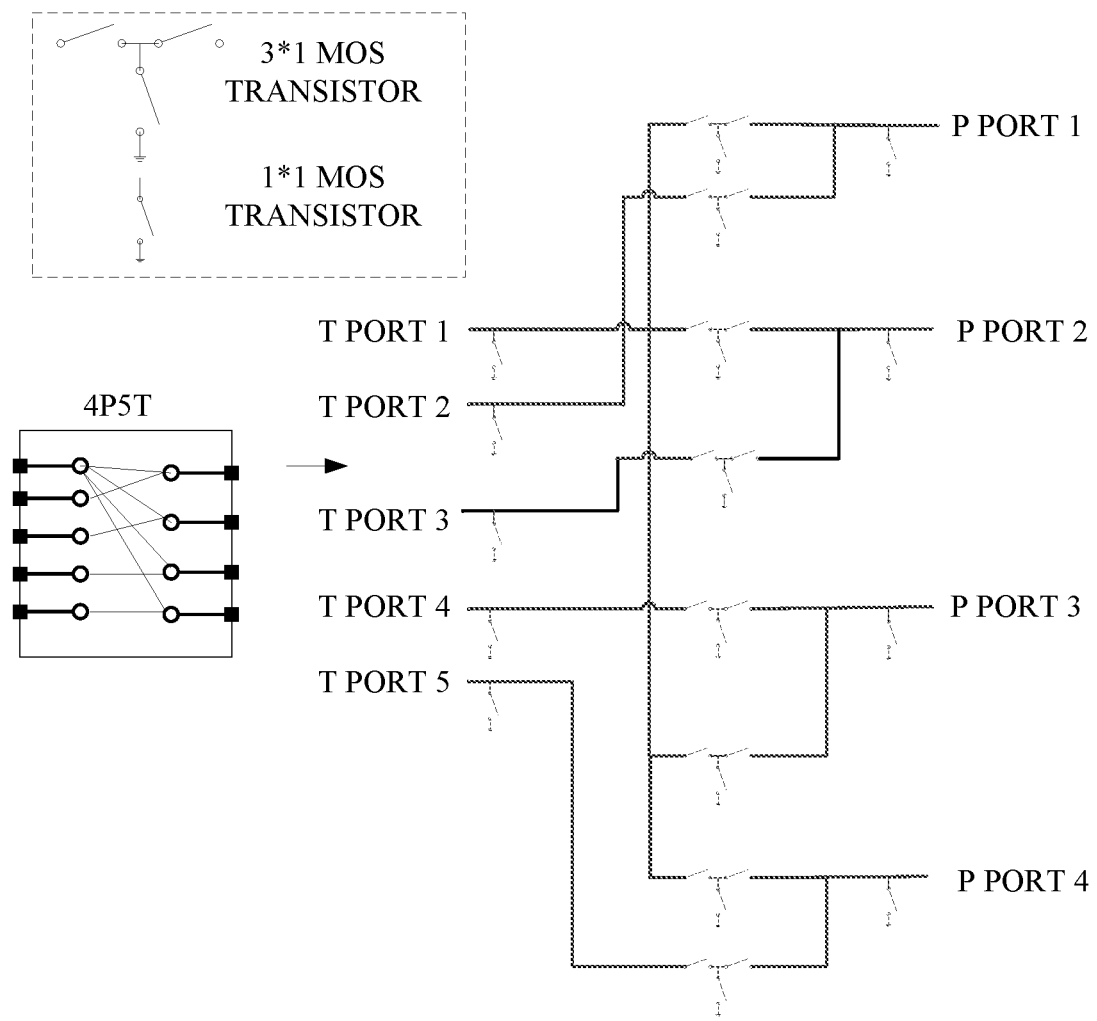
FIG. 10 is a schematic structural diagram illustrating a multiway switch according to an implementation of the present disclosure.

One first T port among the five T ports is a full-coupling port. As illustrated in FIG. 10, the number of FETs of a multiway switch is 5+(1*4+(5−1)*1)*3+4=33.

It can be seen that, by limiting the number of T ports that are fully coupled with four P ports among the five T ports to one, the number of switches of the radio frequency system of the electronic device can be effectively reduced. That is to say, the number of full-coupling T ports has a great influence on the performance of the radio frequency system.

It can be understood that the specific implementation manners of the receiver circuit and the transmitter circuit mentioned-above may be various, and the implementation of the present disclosure is not limited. The matching form of the above radio frequency circuit and the multiway switch includes but is not limited to the structure of the drawing, and is merely an example herein.

In one possible implementation, the four antennas include a first antenna, a second antenna, a third antenna, and a fourth antenna. These four antennas are all operable at a fifth generation new radio (5G NR) frequency band.

The 5G NR band may include, for example, 3.3 GHz to 3.8 GHz and 4.4 GHz to 5 GHz.

In one possible implementation, the four antennas include a first antenna, a second antenna, a third antenna, and a fourth antenna. The first antenna and the fourth antenna are antennas operable at a long term evolution (LTE) frequency band and a 5G NR frequency band. The second antenna and the third antenna are antennas only operable at the 5G NR frequency band.

The first and fourth antennas are configured to support DL 4×4 MIMO of some frequency bands in LTE on terminals. These two receive antennas are shared with the 5G NR antenna (hereinafter, "shared antennas" for short). The LTE frequency band may include, for example, 1880-1920 MHz and 2496-2690 MHz.

Figure 11:
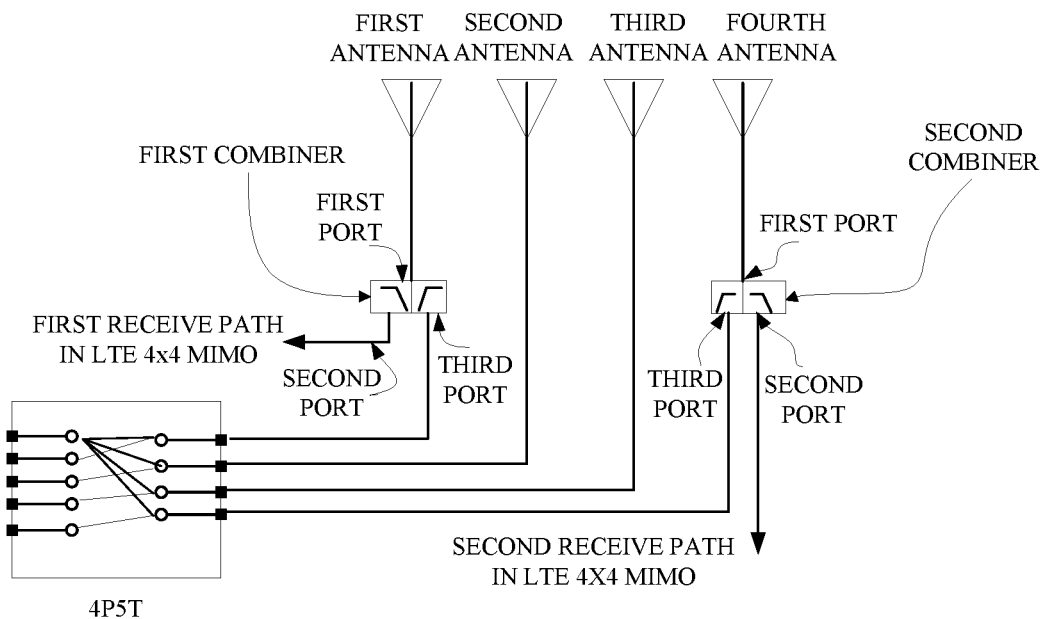
FIG. 11 is a schematic structural diagram illustrating an antenna system of an electronic device according to an implementation of the present disclosure.

In one possible implementation, as illustrated in FIG. 11, the antenna system further includes a first combiner and a second combiner. The first combiner has a first port coupled with the first antenna, a second port coupled with a first receive path in long term evolution 4×4 multiple-input multiple-output (LTE 4×4 MIMO) configuration of the electronic device, and a third port coupled with a corresponding P port of the four P ports of the multiway switch. The second combiner has a first port coupled with the fourth antenna, a second port coupled with a second receive path in LTE 4×4 MIMO configuration of the electronic device, and a third port coupled with a corresponding P port of the four P ports of the multiway switch.

The LTE 4*4 MIMO is a downlink LTE receive circuit and can be defined as a third receive path. Since the LTE currently has two receive paths, in order to support LTE 4×4 MIMO, the third receive path and a fourth receive path are added.

According to performance of the four antennas, the electronic device will configure one antenna with better performance for the circuit for PRX (primary receiver), and the antenna will in a standby state. Moreover, the first T port in the switch having both the transmission function and the reception function can be configured for TX (transmit) and PRX purpose, and thus the antenna can be switched arbitrarily. In this way, there is no need to restrict the coupling between ports of shared antennas.

Figure 12:
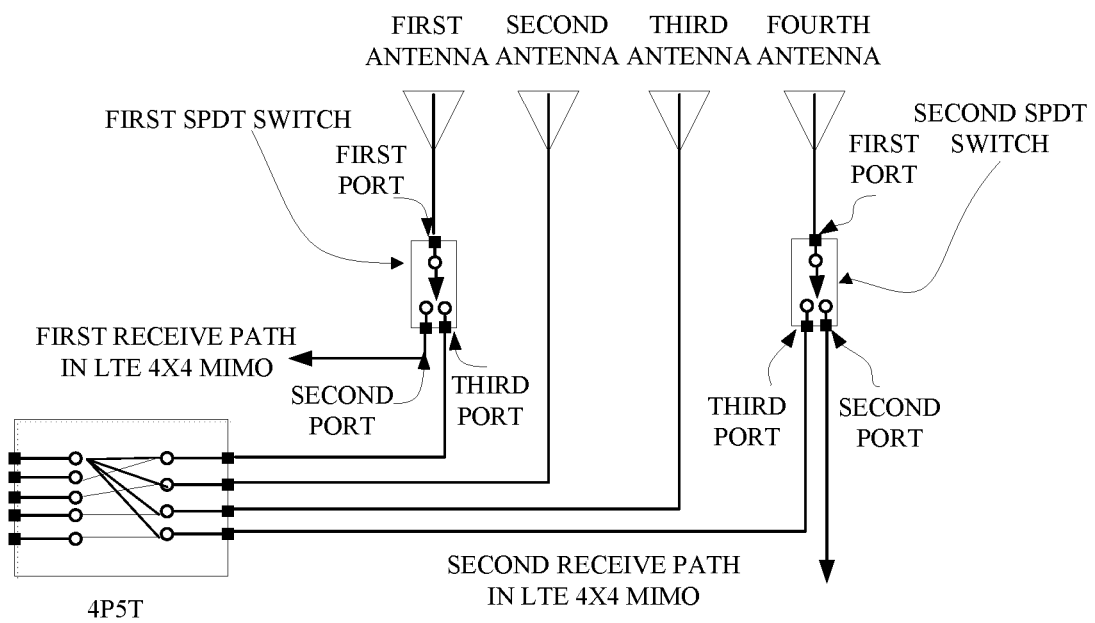
FIG. 12 is a schematic structural diagram illustrating another antenna system of an electronic device according to an implementation of the present disclosure.

In one possible implementation, as illustrated in FIG. 12, the antenna system further includes a first single-pole double-throw (SPDT) switch and a second SPDT switch. The first SPDT switch has a first port coupled with the first antenna, a second port coupled with a first receive path in LTE 4×4 MIMO configuration of the electronic device, and a third port coupled with a corresponding P port of the four P ports of the multiway switch. The second SPDT switch has a first port coupled with the fourth antenna, a second port coupled with a second receive path in LTE 4×4 MIMO configuration of the electronic device, and a third port coupled with a corresponding P port of the four P ports of the multiway switch.

It can be seen that, for the transmit paths and the receive paths of the radio frequency system of the electronic device. The transmit paths can include one single independent switch (a 4P5T switch) or two independent switches (a SPDT switch and a 4P5T switch), and the receive paths can include one single independent switch (a 4P5T switch) or two independent switches (a SPDT switch and a 4P5T switch). That is to say, by integrating more switch functions of the transmit paths and the receive paths of the radio frequency system into the 4P5T switch, the number of independent switches of the transmit paths and the receive paths can be effectively reduced.

The schemes of the disclosure can be combined or replaced with each other. As an example, the radio frequency circuit described above can be applied or combined into the radio frequency system or the wireless communication device below. As another example, the antenna system and/or the multiway switch described above can be applied or combined into the radio frequency system or the wireless communication device below. It is to be noted that, "the antenna system and/or the multiway switch" of the disclosure means "the antenna system", "the multiway switch", or "the antenna system and the multiway switch".

Figure 13:
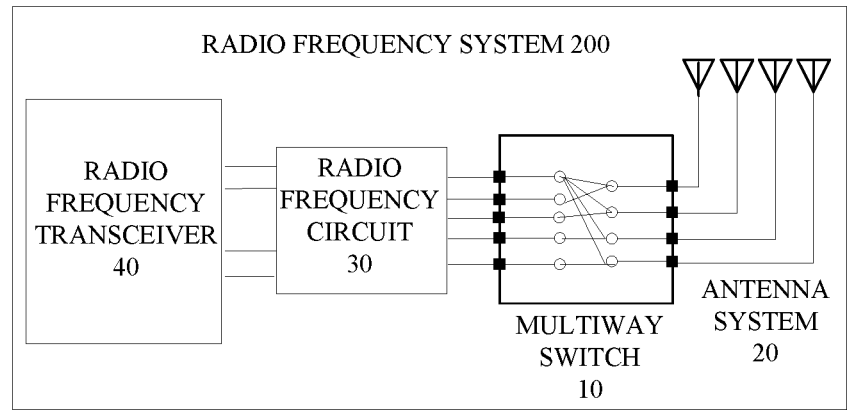
FIG. 13 is a schematic structural diagram illustrating a radio frequency system according to an implementation of the present disclosure.

FIG. 13 is a schematic structural diagram illustrating a radio frequency system 200 according to an implementation of the present disclosure. As illustrated in FIG. 13, the radio frequency system 200 includes an antenna system 20, a radio frequency transceiver 40, a radio frequency circuit 30 coupled with the radio frequency transceiver 40, and the multiway switch 10 according to any of the above implementations.

As an implementation, the multiway switch 10 includes five T ports and four P ports. The five T ports include one first T port supporting only a transmission function and four second T ports supporting only a reception function. The first T port is coupled with all of the four P ports. The antenna system 20 includes four antennas corresponding to the four P ports. The multiway switch 10 is configured to enable a preset function of transmitting an SRS through the four antennas in turn.

Figure 14:
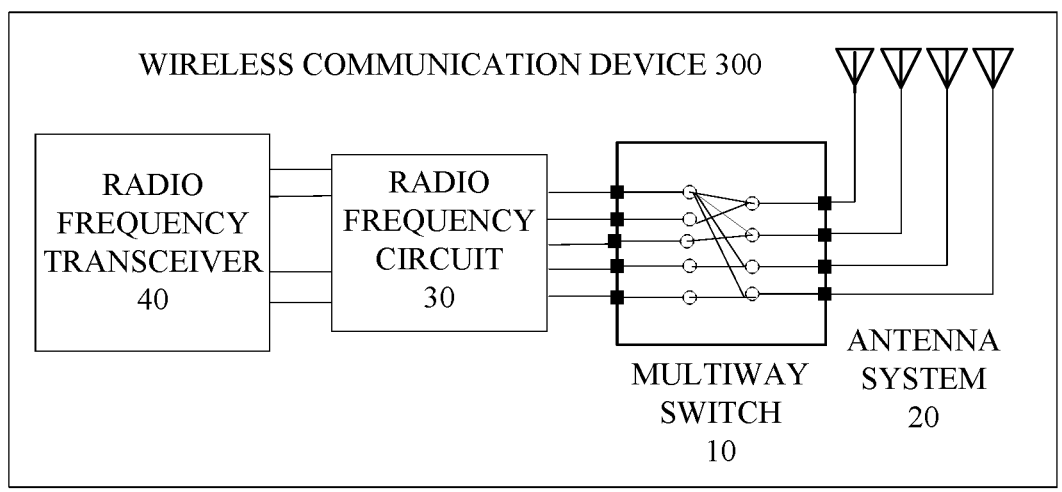
FIG. 14 is a schematic structural diagram illustrating a wireless communication device according to an implementation of the present disclosure.

FIG. 14 is a schematic structural diagram illustrating a wireless communication device 300 according to an implementation of the present disclosure. As illustrated in FIG. 14, the wireless communication device 300 (for example can be a terminal device, a network device, or the like) includes an antenna system 20, a radio frequency transceiver 40, a radio frequency circuit 30 coupled with the radio frequency transceiver 40, and the multiway switch 10 according to any of the above implementations.

As an implementation, the multiway switch 10 includes five T ports and four P ports. The five T ports include one first T port coupled with all of the four P ports. The antenna system 20 includes four antennas corresponding to the four P ports. The multiway switch 10 is configured to enable a preset function of transmitting an SRS through the four antennas in turn.

As another implementation, the five T ports further include four second T ports. Each of the four second T ports is coupled with one of the four P ports, and any two second T ports operable at the same frequency band are coupled with different P ports of the four P ports. Each of the four P ports is coupled with a corresponding antenna of the four antennas. The first T port only supports a transmission function. The four second T ports only support a reception function.

Figure 15:
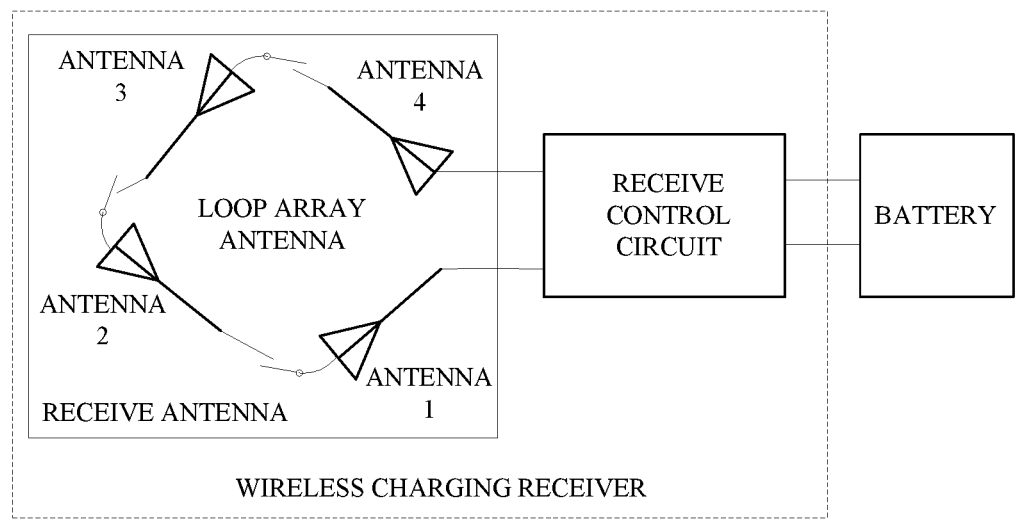
FIG. 15 is a schematic diagram illustrating a wireless charging receiver for multiplexing an antenna of a wireless communication device according to an implementation of the present disclosure.

In addition, as illustrated in FIG. 15, the four antennas of the antenna system described in the implementations of the disclosure can also be multiplexed by a wireless charging receiver of the electronic device. In an implementation, the wireless charging receiver includes a receive antenna and a receive control circuit. The receive antenna matches transmit antennas of a wireless charging transmitter (resonates at the same or similar frequency and transfers energy in a wireless manner in the way of radiative resonant magnetic coupling). The receive control circuit converts, through a loop array antenna, the energy into a direct current (DC) to output to a battery for charging. The receive control circuit can dynamically adjust a frequency of the loop array antenna and enable the frequency of the loop array antenna to be matched with frequencies of the transmit antennas of the wireless charging transmitter, so as to achieve paired charging. Alternatively, the receive control circuit interacts with the wireless charging transmitter in real time on a frequency change range to implement an "exclusive encryption" wireless charging mode.

The receive antenna may be an antenna include at least one of four antennas (When the receive antenna is composed more than one antenna, the antenna is strobed via the switch between the antennas).

Figure 16:
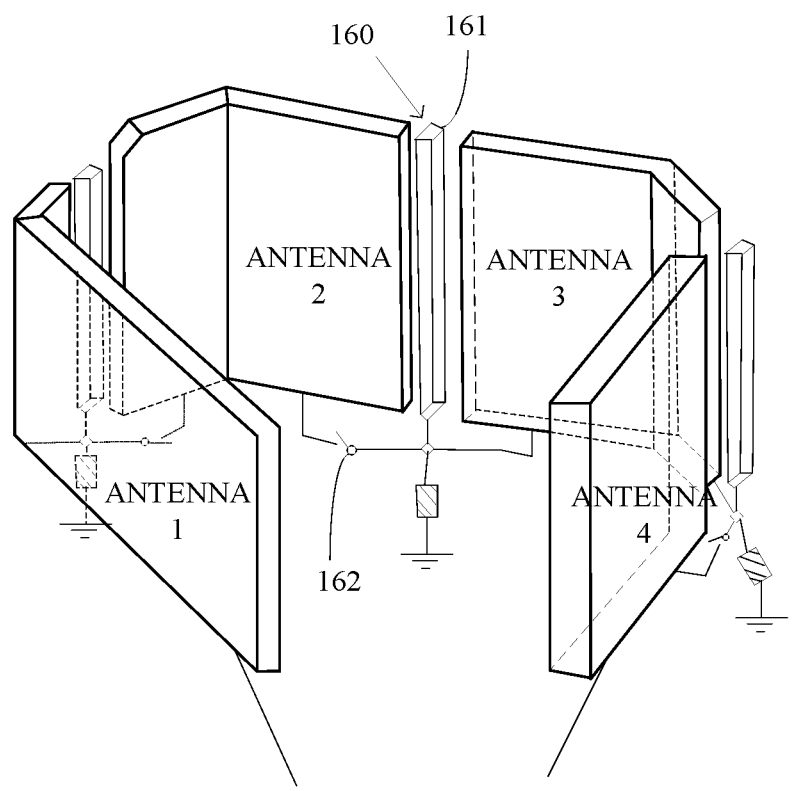
FIG. 16 a schematic structural diagram illustrating a loop array antenna composed of four antennas according to an implementation of the present disclosure.

For example, as illustrated in FIG. 16, the receive antenna is the loop array antenna composed of four antennas. The four antennas include antenna 1, antenna 2, antenna 3, and antenna 4. Antenna 1 and antenna 4 are operable at both a LTE frequency band and a 5G NR frequency band, while antenna 2 and antenna 3 are only operable at the 5G NR frequency band. A port of antenna 1 and a port of antenna 4 are used as ports of the loop array antenna. Adjacent antennas are coupled via a gate circuit 160 with an isolation function. The gate circuit 160 includes a spacer 161 and a switch 162, where the spacer 161 is a conductor and the switch 162 is further coupled with a controller. The electronic device can conduct the switch 162 of each gate circuit 160 in a wireless charging mode to form a loop array antenna for receiving energy. By adding the spacers 161 among the antennas, the gate circuit 160 can reduce mutual coupling among the multiple antennas of the electronic device in a normal communication mode, improve isolation among the multiple antennas, and optimize performance of the antennas. On the other hand, the multiple antennas can be coupled in series to form the loop array antenna through the switches 162, so as to better match the transmit antennas to transfer energy. Furthermore, since the capabilities of antenna 1 and antenna 4 are stronger than those of antenna 2 and antenna 3, the loop array antenna thus arranged can reduce energy loss in transmission as much as possible.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A multiway switch, comprising:
five throw (T) ports and four pole (P) ports; the five T ports comprising one first T port and four second T ports, the first T port being coupled with all the four P ports, and each of the four second T ports being coupled with only one of the four P ports; and
the multiway switch being configured to be coupled with a radio frequency circuit and an antenna system of an electronic device operable in a dual-frequency single-transmit mode, to enable a preset function of the electronic device, the antenna system comprising four antennas corresponding to the four P ports, and the preset function being a function of transmitting a sounding reference signal (SRS) through the four antennas in turn.

2. The multiway switch of claim 1, wherein
among the four second T ports, second T ports operable at the same frequency band are coupled with different P ports of the four P ports;
each of the four P ports is coupled with a corresponding antenna of the four antennas in one-to-one correspondence;
the first T port only supports a transmission function; and
the four second T ports only support a reception function.

3. A radio frequency system, comprising an antenna system, a radio frequency transceiver, a radio frequency circuit coupled with the radio frequency transceiver, and a multiway switch coupled with the radio frequency circuit and the antenna system;
the multiway switch comprising five T ports and four P ports; the five T ports comprising one first T port supporting only a transmission function and four second T ports supporting only a reception function, the first T port being coupled with all the four P ports, and each of the four second T ports being coupled with only one of the four P ports;
the antenna system comprising four antennas corresponding to the four P ports; and
the multiway switch being configured to enable a preset function of transmitting an SRS through the four antennas in turn.

4. The radio frequency system of claim 3, wherein
the radio frequency circuit physically comprises one independent circuit module; and
the independent circuit module has one transmit port and receive ports, the transmit port is configured to be coupled with the first T port, and each receive port is configured to be coupled with a corresponding second T port.

5. The radio frequency system of claim 4, wherein the independent circuit module comprises one first port and second ports, the first port is configured to be coupled with the first T port of the multiway switch, and each second port is configured to be coupled with a corresponding second T port of the multiway switch, wherein
the independent circuit module comprises one transmitter integrated circuit and four receiver integrated circuits;
the transmitter integrated circuit comprises two transmitter circuits having transmit ports coupled with the first port of the independent circuit module; and
each of the four receiver integrated circuits comprises two receiver circuits having receive ports coupled with one of the second ports of the independent circuit module.

6. The radio frequency system of claim 5, wherein
the receiver circuit comprises a low-noise amplifier (LNA) and a first filter; the first filter has an input port coupled with a corresponding second port of the independent circuit module, the first filter has an output port coupled with an input port of the LNA, and the LNA has an output port coupled with a corresponding port of a radio frequency transceiver;

the transmitter circuit comprises a power amplifier (PA), a second filter, and a power coupler; the PA has an input port coupled with a corresponding port of the radio frequency transceiver, the PA has an output port coupled with an input port of the second filter, the second filter has an output port coupled with an input port of the power coupler, and the power coupler has an output port coupled with the first port of the independent circuit module;

the receiver integrated circuit comprises two receiver circuits operable at different frequency bands and integrated through a switch of the receiver integrated circuit, the switch of the receiver integrated circuit has an input port and two output ports, the input port of the switch of the receiver integrated circuit is coupled with a corresponding second port of the independent circuit module, each of the two output ports of the switch of the receiver integrated circuit is coupled with one of two input ports of two first filters of the two receiver circuits; and the transmitter integrated circuit comprises two transmitter circuits operable at different frequency bands and sharing the input port of the power coupler, and the output port of the power coupler is coupled with the first port of the independent circuit module through a switch of the transmitter integrated circuit.

7. The radio frequency system of claim 3, wherein the radio frequency circuit physically comprises two independent circuit modules; and the two independent circuit modules have one transmit port and receive ports, the transmit port is configured to be coupled with the first T port, and each receive port is configured to be coupled with a corresponding second T port.

8. The radio frequency system of claim 7, wherein the two independent circuit modules comprise one first independent circuit module and one second independent circuit module, wherein the first independent circuit module comprises one first port configured to be coupled with the first T port of the multiway switch; wherein the second independent circuit module comprises second ports, and each second port is configured to be coupled with a corresponding second T port of the multiway switch;

the first independent circuit module comprises one transmitter integrated circuit, wherein the transmitter integrated circuit comprises two transmitter circuits having transmit ports coupled with the first port of the first independent circuit module; and the second independent circuit module comprises four receiver integrated circuits, wherein each of the four receiver integrated circuits comprises two receiver circuits having receive ports coupled with one of the second ports of the second independent circuit module.

9. The radio frequency system of claim 7, wherein the two independent circuit modules comprise one first independent circuit module and one second independent circuit module; wherein the first independent circuit module comprises one first port and second ports, the first port is configured to be coupled with the first T port of the multiway switch, and each second port of the first independent circuit module is configured to be coupled with a corresponding second T port of the multiway switch; wherein the second independent circuit module comprises second ports, and each second port of the second independent circuit module is configured to be coupled with a corresponding second T port of the multiway switch;

the first independent circuit module comprises one transmitter integrated circuit and two receiver integrated circuits; wherein the transmitter integrated circuit comprises two transmitter circuits having transmit ports coupled with the first port of the first independent circuit module; wherein each receiver integrated circuit of the first independent circuit module comprises two receiver circuits having receive ports coupled with one of the second ports of the first independent circuit module; and the second independent circuit module comprises two receiver integrated circuits, wherein each receiver integrated circuit of the second independent circuit module comprises two receiver circuits having receive ports coupled with one of the second ports of the second independent circuit module.

10. The radio frequency system of claim 3, wherein the radio frequency circuit physically comprises three independent circuit modules; and the three independent circuit modules have one transmit port and receive ports, the transmit port is configured to be coupled with the first T port, and each receive port is configured to be coupled with a corresponding second T port.

11. The radio frequency system of claim 10, wherein the three independent circuit modules comprise one first independent circuit module, one second independent circuit module, and one third independent circuit module, wherein the first independent circuit module comprises one first port configured to be coupled with the first T port of the multiway switch, wherein the second independent circuit module and the third independent circuit module each comprise second ports, and each second port is configured to be coupled with a corresponding second T port of the multiway switch;

the first independent circuit module comprises one transmitter integrated circuit, wherein the transmitter integrated circuit comprises two transmitter circuits having transmit ports coupled with the first port of the first independent circuit module;

the second independent circuit module comprises two receiver integrated circuits, wherein each receiver integrated circuit of the second independent circuit module comprises two receiver circuits having receive ports coupled with one of the second ports of the second independent circuit module; and the third independent circuit module comprises two receiver integrated circuits, wherein each receiver integrated circuit of the third independent circuit module comprises two receiver circuits having receive ports coupled with one of the second ports of the third independent circuit module.

12. The radio frequency system of claim 10, wherein the three independent circuit modules comprise one first independent circuit module, one second independent circuit module, and one third independent circuit module; wherein the first independent circuit module comprises one first port configured to be coupled with the first T port of the multiway switch, wherein the second independent circuit module comprises one second port and the third independent circuit module comprises second ports, and each second port is configured to be coupled with a corresponding second T port of the multiway switch;

the first independent circuit module comprises one transmitter integrated circuit, wherein the transmitter integrated circuit comprises two transmitter circuits having transmit ports coupled with the first port of the first independent circuit module;

the second independent circuit module comprises one receiver integrated circuit, wherein the receiver integrated circuit of the second independent circuit module comprises two receiver circuits having receive ports coupled with the second port of the second independent circuit module; and the third independent circuit module comprises three receiver integrated circuits, wherein each receiver integrated circuit of the third independent circuit module comprises two receiver circuits having receive ports coupled with one of the second ports of the third independent circuit module.

13. The radio frequency system of claim 10, wherein the three independent circuit modules comprise one first independent circuit module, one second independent circuit module, and one third independent circuit module, wherein the first independent circuit module comprises one first port and second ports, the first port is configured to be coupled with the first T port of the multiway switch, and each second port is configured to be coupled with a corresponding second T port of the multiway switch, wherein the second independent circuit module and the third independent circuit module each comprise one second port, and each second port is configured to be coupled with a corresponding second T port of the multiway switch;

the first independent circuit module comprises one transmitter integrated circuit and two receiver integrated circuits, wherein the transmitter integrated circuit comprises two transmitter circuits having transmit ports coupled with the first port of the first independent circuit module, wherein each receiver integrated circuit of the first independent circuit module comprises two receiver circuits having receive ports coupled with one of the second ports of the first independent circuit module;

the second independent circuit module comprises one receiver integrated circuit, wherein the receiver integrated circuit of the second independent circuit module comprises two receiver circuits having receive ports coupled with the second port of the second independent circuit module; and the third independent circuit module comprises one receiver integrated circuit, wherein the receiver integrated circuit of the third independent circuit module comprises two receiver circuits having receive ports coupled with the second port of the third independent circuit module.

14. The radio frequency system of claim 3, wherein
the radio frequency circuit physically comprises four independent circuit modules; and
the four independent circuit modules have one transmit port and receive ports, the transmit port is configured to be coupled with the first T port, and each receive port is configured to be coupled with a corresponding second T port.

15. The radio frequency system of claim 14, wherein the four independent circuit modules comprise one first independent circuit module, one second independent circuit module, one third independent circuit module, and one fourth independent circuit module, wherein the first independent circuit module comprises one first port configured to be coupled with the first T port of the multiway switch, wherein the second independent circuit module comprises second ports, the third independent circuit module and the fourth independent circuit module each comprise one second port, and each second port is configured to be coupled with a corresponding second T port of the multiway switch;

the first independent circuit module comprises one transmitter integrated circuit, wherein the transmitter integrated circuit comprises two transmitter circuits having transmit ports coupled with the first port of the first independent circuit module;

the second independent circuit module comprises two receiver integrated circuits, wherein each receiver integrated circuit of the second independent circuit module comprises two receiver circuits having receive ports coupled with one of the second ports of the second independent circuit module;

the third independent circuit module comprises one receiver integrated circuit, wherein the receiver integrated circuit of the third independent circuit module comprises two receiver circuits having receive ports coupled with the second port of the third independent circuit module; and the fourth independent circuit module comprises one receiver integrated circuit, wherein the receiver integrated circuit of the fourth independent circuit module comprises two receiver circuits having receive ports coupled with the second port of the fourth independent circuit module.

16. The radio frequency system of claim 14, wherein the four independent circuit modules comprise one first independent circuit module, one second independent circuit module, one third independent circuit module, and one fourth independent circuit module, wherein the first independent circuit module comprises one first port and one second port, the first port is configured to be coupled with the first T port of the multiway switch, and the second port of the first independent circuit module is configured to be coupled with a corresponding second T port of the multiway switch, wherein the second independent circuit module, the third independent circuit module, and the fourth independent circuit module each comprise one second port, and each second port is configured to be coupled with a corresponding second T port of the multiway switch;

the first independent circuit module comprises one transmitter integrated circuit and one receiver integrated circuit, wherein the transmitter integrated circuit comprises two transmitter circuits having transmit ports coupled with the first port of the first independent circuit module, wherein the receiver integrated circuit of the first independent circuit module comprises two receiver circuits having receive ports coupled with the second port of the first independent circuit module;

the second independent circuit module comprises one receiver integrated circuit, wherein the receiver integrated circuit of the second independent circuit module comprises two receiver circuits having receive ports coupled with the second port of the second independent circuit module;

the third independent circuit module comprises one receiver integrated circuit, wherein the receiver integrated circuit of the third independent circuit module comprises two receiver circuits having receive ports coupled with the second port of the third independent circuit module; and the fourth independent circuit module comprises one receiver integrated circuit, wherein the receiver integrated circuit of the fourth independent circuit module comprises two receiver circuits having receive ports coupled with the second port of the fourth independent circuit module.

17. The radio frequency system of claim 3, wherein
the radio frequency circuit physically comprises five independent circuit modules; and
the five independent circuit modules have one transmit port and receive ports, the transmit port is configured to be coupled with the first T port, and each receive port is configured to be coupled with a corresponding second T port.

18. The radio frequency system of claim 3, wherein the multiway switch comprises thirty-three field-effect transistors (FETs).

19. A wireless communication device, comprising a radio frequency transceiver, a radio frequency circuit coupled with the radio frequency transceiver, an antenna system, and a multiway switch coupled with the radio frequency circuit and the antenna system;
the multiway switch comprising five T ports and four P ports; the five T ports comprising one first T port and four second T ports, the first T port being coupled with all the four P ports, and each of the four second T ports being coupled with only one of the four P ports;
the antenna system comprising four antennas corresponding to the four P ports; and
the multiway switch being configured to enable a preset function of transmitting an SRS through the four antennas in turn.

20. The wireless communication device of claim 19, wherein
any two second T ports operable at the same frequency band are coupled with different P ports of the four P ports;
each of the four P ports is coupled with a corresponding antenna of the four antennas;
the first T port supports only a transmission function; and
the four second T ports support only a reception function.

* * * * *